(12) United States Patent
Choi et al.

(10) Patent No.: US 9,130,515 B2
(45) Date of Patent: Sep. 8, 2015

(54) APPARATUS AND METHOD FOR BALANCED POWER AMPLIFICATION

(71) Applicants: Samsung Electronics Co., Ltd., Suwon-si (KR); SUNGKYUNKWAN UNIVERSITY Foundation for Corporate Collaboration, Suwon-si (KR)

(72) Inventors: Jin Sung Choi, Seoul (KR); Sang Wook Kwon, Seongnam-si (KR); Ki Young Kim, Yongin-si (KR); Nam Yun Kim, Seoul (KR); Dong Zo Kim, Yongin-si (KR); Yun Kwon Park, Dongducheon-si (KR); Eun Seok Park, Yongin-si (KR); Keum Su Song, Seoul (KR); Young Ho Ryu, Yongin-si (KR); Chang Wook Yoon, Seoul (KR); Youngoo Yang, Suwon-si (KR)

(73) Assignees: Samsung Electronics Co., Ltd., Suwon-si (KR); SUNGKYUNKWAN UNIVERSITY Foundation for Corporate Collaboration, Suwon-si (KR)

( * ) Notice: Subject to any disclaimer, the term of this patent is extended or adjusted under 35 U.S.C. 154(b) by 126 days.

(21) Appl. No.: 13/863,466

(22) Filed: Apr. 16, 2013

(65) Prior Publication Data

US 2013/0271222 A1 Oct. 17, 2013

(30) Foreign Application Priority Data

Apr. 17, 2012 (KR) .................. 10-2012-0039750

(51) Int. Cl.
*H03F 3/68* (2006.01)
*H03F 3/24* (2006.01)
*H03F 1/56* (2006.01)

(Continued)

(52) U.S. Cl.
CPC ............... *H03F 3/245* (2013.01); *H03F 1/565* (2013.01); *H03F 3/211* (2013.01); *H03F 3/602* (2013.01); *H03F 2200/192* (2013.01);
(Continued)

(58) Field of Classification Search
USPC ....................................... 330/295, 53, 124 R
IPC ......................................................... H03F 3/68
See application file for complete search history.

(56) References Cited

U.S. PATENT DOCUMENTS

| 4,656,434 A | 4/1987 | Selin |
| 4,717,884 A | 1/1988 | Mitzlaff |

(Continued)

FOREIGN PATENT DOCUMENTS

| JP | 2007-281691 A | 10/2007 |
| JP | 2010-041588 A | 2/2010 |

(Continued)

*Primary Examiner* — Patricia T Nguyen
(74) *Attorney, Agent, or Firm* — NSIP Law

(57) ABSTRACT

An apparatus and a method for balanced power amplification are provided. An amplifier includes a splitter configured to split an input signal into a first input signal and a second input signal that include a 90° phase difference. The amplifier further includes a first power amplifier (PA) configured to amplify the first input signal to generate a first output signal. The amplifier further includes a second PA configured to amplify the second input signal to generate a second output signal. The amplifier further includes a combiner configured to combine the first output signal and the second output signal that include the 90° phase difference to generate an output signal.

18 Claims, 12 Drawing Sheets

(51) Int. Cl.
*H03F 3/21* (2006.01)
*H03F 3/60* (2006.01)

(52) U.S. Cl.
CPC .... *H03F 2200/198* (2013.01); *H03F 2200/204* (2013.01); *H03F 2203/21139* (2013.01)

(56) References Cited

U.S. PATENT DOCUMENTS

| | | | |
|---|---|---|---|
| 5,329,249 A | 7/1994 | Cripps | |
| 6,356,149 B1* | 3/2002 | Stengel et al. | 330/107 |
| 2002/0093383 A1* | 7/2002 | Thompson | 330/295 |
| 2006/0006949 A1* | 1/2006 | Burns et al. | 330/301 |
| 2007/0109070 A1* | 5/2007 | Singh | 333/109 |
| 2008/0180190 A1* | 7/2008 | Chan et al. | 333/118 |
| 2011/0133835 A1 | 6/2011 | Castaneda et al. | |
| 2012/0133442 A1* | 5/2012 | Blednov | 330/295 |
| 2012/0299660 A1* | 11/2012 | Arkiszewski et al. | 330/296 |

FOREIGN PATENT DOCUMENTS

| | | |
|---|---|---|
| KR | 10-2003-0063338 A | 7/2003 |
| KR | 10-2005-0079713 A | 8/2005 |
| KR | 10-2007-0014087 A | 1/2007 |
| KR | 10-2007-0103747 A | 10/2007 |
| KR | 10-2008-0108527 A | 12/2008 |
| KR | 10-2009-0126035 A | 12/2009 |
| KR | 10-2011-0068075 A | 6/2011 |
| KR | 10-2011-0087526 A | 6/2011 |

* cited by examiner

→ INPUT CURRENT
---→ INDUCED CURRENT

APPARATUS AND METHOD FOR BALANCED POWER AMPLIFICATION

CROSS-REFERENCE TO RELATED APPLICATION(S)

This application claims the benefit under 35 U.S.C. §119(a) of Korean Patent Application No. 10-2012-0039750, filed on Apr. 17, 2012, in the Korean Intellectual Property Office, the entire disclosure of which is incorporated herein by reference for all purposes.

BACKGROUND

1. Field

The following description relates to an apparatus and a method for balanced power amplification.

2. Description of Related Art

A wireless power refers to energy that is transferred from a wireless power transmitter to a wireless power receiver through magnetic coupling. Accordingly, a wireless power transmission and charging system includes a source device and a target device. The source device may wirelessly transmit a power, and the target device may wirelessly receive a power. The source device may be referred to as a wireless power transmitter, and the target device may be referred to as a wireless power receiver.

The source device includes a source resonator, and the target device includes a target resonator. Magnetic coupling or resonance coupling may be formed between the source resonator and the target resonator.

In a transmitter for wireless communication or wireless power transmission, high energy efficiency and safety of operation may be factors. For example, a power amplifier (PA) may correspond to one of a number of components of the transmitter that cause the greatest effects on performance of the transmitter. High energy efficiency and safety of operation may be needed for the PA. The PA may be connected to a transmitting antenna such that the PA may include unstable load conditions, which may be changed depending on an external environment.

Generally, a PA of a very high frequency band may be designed under a condition that the PA may include a load of about 50 ohms ($\Omega$). Under the preceding condition, the PA may provide an excellent performance. However, when the load is changed, the PA may experience a drastic change in overall performance, for example, an output power, efficiency, linearity, and/or the like. One response to the change in the performance resulting from the change in the load may be to use an isolator between an output end of the PA and an input end of a transmitting antenna connected to the PA.

SUMMARY

In one general aspect, there is provided an amplifier including a splitter configured to split an input signal into a first input signal and a second input signal that include a 90° phase difference. The amplifier further includes a first power amplifier (PA) configured to amplify the first input signal to generate a first output signal. The amplifier further includes a second PA configured to amplify the second input signal to generate a second output signal. The amplifier further includes a combiner configured to combine the first output signal and the second output signal that include the 90° phase difference to generate an output signal.

In another general aspect, there is provided an amplification method including splitting an input signal into a first input signal and a second input signal that include a 90° phase difference. The amplification method further includes amplifying the first input signal to generate a first output signal. The amplification method further includes amplifying the second input signal to generate a second output signal. The amplification method further includes combining the first output signal and the second output signal that include a 90° phase difference to generate an output signal.

Other features and aspects will be apparent from the following detailed description, the drawings, and the claims.

Figure 1:
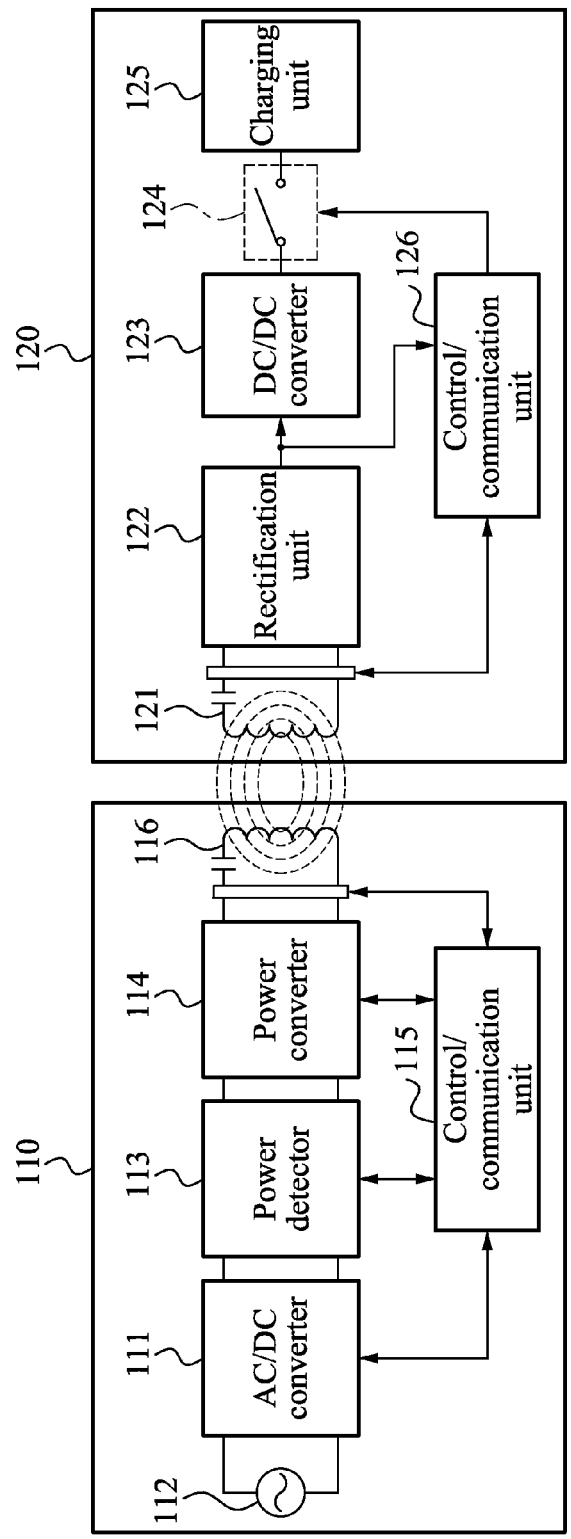
FIG. 1 is a diagram illustrating an example of a wireless power transmission and charging system.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, description of well-known functions and constructions may be omitted for increased clarity and conciseness.

FIG. 1 is a diagram illustrating an example of a wireless power transmission and charging system. Referring to FIG. 1, the wireless power transmission and charging system includes a source device 110 and a target device 120. The source device 110 is a device supplying wireless power, and may be any of various devices that supply power, such as pads, terminals, televisions (TVs), and any other device that supplies power. The target device 120 is a device receiving wireless power, and may be any of various devices that consume power, such as terminals, TVs, vehicles, washing machines, radios, lighting systems, and any other device that consumes power.

The source device 110 includes an alternating current-to-direct current (AC/DC) converter 111, a power detector 113, a power converter 114, a control and communication (control/communication) unit 115, and a source resonator 116.

The target device 120 includes a target resonator 121, a rectification unit 122, a DC-to-DC (DC/DC) converter 123, a switch unit 124, a charging unit 125, and a control/communication unit 126.

The AC/DC converter 111 generates a DC voltage by rectifying an AC voltage having a frequency of tens of hertz (Hz) output from a power supply 112. The AC/DC converter 111 may output a DC voltage having a predetermined level, or may output a DC voltage having an adjustable level by the control/communication unit 115.

The power detector 113 detects an output current and an output voltage of the AC/DC converter 111, and provides, to the control/communication unit 115, information on the detected current and the detected voltage. Additionally, the power detector 113 detects an input current and an input voltage of the power converter 114.

The power converter 114 generates a power by converting the DC voltage output from the AC/DC converter 111 to an AC voltage using a switching pulse signal having a frequency of a few kilohertz (kHz) to tens of megahertz (MHz). In other words, the power converter 114 converts a DC voltage supplied to a power amplifier to an AC voltage using a reference resonance frequency $F_{Ref}$, and generates a communication power to be used for communication, or a charging power to be used for charging that may be used in a plurality of target devices. The communication power may be, for example, a low power of 0.1 to 1 milliwatts (mW) that may be used by a target device to perform communication, and the charging power may be, for example, a high power of 1 mW to 200 Watts (W) that may be consumed by a device load of a target device. In this description, the term "charging" may refer to supplying power to an element or a unit that charges a battery or other rechargeable device with power. Also, the term "charging" may refer supplying power to an element or a unit that consumes power. For example, the term "charging power" may refer to power consumed by a target device while operating, or power used to charge a battery of the target device. The unit or the element may include, for example, a battery, a display device, a sound output circuit, a main processor, and various types of sensors.

In this description, the term "reference resonance frequency" refers to a resonance frequency that is nominally used by the source device 110, and the term "tracking frequency" refers to a resonance frequency used by the source device 110 that has been adjusted based on a predetermined scheme.

The control/communication unit 115 may detect a reflected wave of the communication power or a reflected wave of the charging power, and may detect mismatching between the target resonator 121 and the source resonator 116 based on the detected reflected wave. The control/communication unit 115 may detect the mismatching by detecting an envelope of the reflected wave, or by detecting an amount of a power of the reflected wave. The control/communication unit 115 may calculate a voltage standing wave ratio (VSWR) based on a voltage level of the reflected wave and a level of an output voltage of the source resonator 116 or the power converter 114. When the VSWR is greater than a predetermined value, the control/communication unit 115 detects the mismatching. In this example, the control/communication unit 115 calculates a power transmission efficiency of each of N predetermined tracking frequencies, determines a tracking frequency $F_{Best}$ having the best power transmission efficiency among the N predetermined tracking frequencies, and changes the reference resonance frequency $F_{Ref}$ to the tracking frequency $F_{Best}$.

Also, the control/communication unit 115 may control a frequency of the switching pulse signal used by the power converter 114. By controlling the switching pulse signal used by the power converter 114, the control/communication unit 115 may generate a modulation signal to be transmitted to the target device 120. In other words, the control/communication unit 115 may transmit various messages to the target device 120 via in-band communication. Additionally, the control/communication unit 115 may detect a reflected wave, and may demodulate a signal received from the target device 120 through an envelope of the reflected wave.

The control/communication unit 115 may generate a modulation signal for in-band communication using various schemes. To generate a modulation signal, the control/communication unit 115 may turn on or off the switching pulse signal used by the power converter 114, or may perform delta-sigma modulation. Additionally, the control/communication unit 115 may generate a pulse-width modulation (PWM) signal having a predetermined envelope.

The control/communication unit 115 may perform out-of-band communication using a communication channel. The control/communication unit 115 may include a communication module, such as a ZigBee module, a Bluetooth module, or any other communication module, that the control/communication unit 115 may use to perform the out-of-band communication. The control/communication unit 115 may transmit or receive data to or from the target device 120 via the out-of-band communication.

The source resonator 116 transfers electromagnetic energy, such as the communication power or the charging power, to the target resonator 121 via a magnetic coupling with the target resonator 121.

The target resonator 121 receives the electromagnetic energy, such as the communication power or the charging power, from the source resonator 116 via a magnetic coupling with the source resonator 116. Additionally, the target resonator 121 receives various messages from the source device 110 via the in-band communication.

The rectification unit 122 generates a DC voltage by rectifying an AC voltage received by the target resonator 121.

The DC/DC converter 123 adjusts a level of the DC voltage output from the rectification unit 122 based on a voltage rating of the charging unit 125. For example, the DC/DC converter 123 may adjust the level of the DC voltage output from the rectification unit 122 to a level in a range from 3 volts (V) to 10 V.

The switch unit 124 is turned on or off by the control/communication unit 126. When the switch unit 124 is turned off, the control/communication unit 115 of the source device 110 may detect a reflected wave. In other words, when the switch unit 124 is turned off, the magnetic coupling between the source resonator 116 and the target resonator 121 is interrupted.

The charging unit 125 may include a battery. The charging unit 125 may charge the battery using the DC voltage output from the DC/DC converter 123.

The control/communication unit 126 may perform in-band communication for transmitting or receiving data using a resonance frequency by demodulating a received signal obtained by detecting a signal between the target resonator 121 and the rectification unit 122, or by detecting an output signal of the rectification unit 122. In other words, the control/communication unit 126 may demodulate a message received via the in-band communication.

Additionally, the control/communication unit 126 may adjust an impedance of the target resonator 121 to modulate a signal to be transmitted to the source device 110. Specifically, the control/communication unit 126 may modulate the signal to be transmitted to the source device 110 by turning the switch unit 124 on and off. For example, the control/communication unit 126 may increase the impedance of the target resonator by turning the switch unit 124 off so that a reflected wave will be detected by the control/communication unit 115 of the source device 110. In this example, depending on whether the reflected wave is detected, the control/communication unit 115 of the source device 110 will detect a binary number "0" or "1."

The control/communication unit 126 may transmit, to the source device 110, any one or any combination of a response message including a product type of a corresponding target device, manufacturer information of the corresponding target device, a product model name of the corresponding target device, a battery type of the corresponding target device, a charging scheme of the corresponding target device, an impedance value of a load of the corresponding target device, information about a characteristic of a target resonator of the corresponding target device, information about a frequency band used the corresponding target device, an amount of power to be used by the corresponding target device, an intrinsic identifier of the corresponding target device, product version information of the corresponding target device, and standards information of the corresponding target device.

The control/communication unit 126 may also perform an out-of-band communication using a communication channel. The control/communication unit 126 may include a communication module, such as a ZigBee module, a Bluetooth module, or any other communication module known in the art, that the control/communication unit 126 may use to transmit or receive data to or from the source device 110 via the out-of-band communication.

The control/communication unit 126 may receive a wake-up request message from the source device 110, detect an amount of a power received by the target resonator, and transmit, to the source device 110, information about the amount of the power received by the target resonator. In this example, the information about the amount of the power received by the target resonator may correspond to an input voltage value and an input current value of the rectification unit 122, an output voltage value and an output current value of the rectification unit 122, or an output voltage value and an output current value of the DC/DC converter 123.

The control/communication unit 115 may set a resonance bandwidth of the source resonator 116. Based on the set resonance bandwidth of the source resonator 116, a Q-factor $Q_S$ of the source resonator 116 may be determined.

The control/communication unit 126 may set a resonance bandwidth of the target resonator 121. Based on the set resonance bandwidth of the target resonator 121, a Q-factor $Q_D$ of the target resonator 121 may be determined. In this example, the resonance bandwidth of the source resonator 116 may be set to be wider or narrower than the resonance bandwidth of the target resonator 121. By communicating with each other, the source device 110 and the target device 120 may share information regarding the resonance bandwidths of the source resonator 116 and the target resonator 121. When a power higher than a reference value is requested by the target device 120, the Q-factor $Q_S$ of the source resonator 116 may be set to a value greater than 100. When a power lower than the reference value is requested by the target device 120, the Q-factor $Q_S$ of the source resonator 116 may be set to a value less than 100.

In resonance-based wireless power transmission, a resonance bandwidth is a significant factor. If Qt indicates a Q-factor based on a change in a distance between the source resonator 116 and the target resonator 121, a change in a resonance impedance, impedance-mismatching, a reflected signal, or any other factor affecting a Q-factor, Qt is inversely proportional to a resonance bandwidth as expressed by the following Equation 1:

$$\frac{\Delta f}{f_0} = \frac{1}{Qt} \qquad (1)$$
$$= \Gamma_{S,D} + \frac{1}{BW_S} + \frac{1}{BW_D}$$

In Equation 1, $f_0$ denotes a center frequency, $\Delta f$ denotes a bandwidth, $\Gamma_{S,D}$ denotes a reflection loss between resonators, $BW_S$ denotes a resonance bandwidth of the source resonator 116, and $BW_D$ denotes a resonance bandwidth of the target resonator 121.

An efficiency U of wireless power transmission may be expressed by the following Equation 2:

$$U = \frac{\kappa}{\sqrt{\Gamma_S \Gamma_D}} = \frac{\omega_0 M}{\sqrt{R_S R_D}} = \frac{\sqrt{Q_S Q_D}}{Q_\kappa} \qquad (2)$$

In Equation 2, $\kappa$ denotes a coupling coefficient of energy coupling between the source resonator 116 and the target resonator 121, $\Gamma_S$ denotes a reflection coefficient of the source resonator 116, $\Gamma_D$ denotes a reflection coefficient of the target resonator 121, $\omega_0$ denotes a resonance frequency, M denotes a mutual inductance between the source resonator 116 and the target resonator 121, $R_S$ denotes an impedance of the source resonator 116, $R_D$ denotes an impedance of the target resonator 121, $Q_S$ denotes a Q-factor of the source resonator 116, $Q_D$ denotes a Q-factor of the target resonator 121, and $Q_\kappa$ denotes a Q-factor of energy coupling between the source resonator 116 and the target resonator 121.

As can be seen from Equation 2, the Q-factor has a great effect on an efficiency of the wireless power transmission. Accordingly, the Q-factor may be set to a high value to increase the efficiency of the wireless power transmission. However, even when $Q_S$ and $Q_D$ are set to high values, the efficiency of the wireless power transmission may be reduced by a change in the coupling coefficient $\kappa$ of the energy coupling, a change in a distance between the source resonator 116 and the target resonator 121, a change in a resonance impedance, impedance mismatching, and any other factor affecting the efficiency of the wireless power transmission.

If the resonance bandwidths $BW_S$ and $BW_D$ of the source resonator 116 and the target resonator 121 are set to be too narrow to increase the efficiency of the wireless power transmission, impedance mismatching and other undesirable conditions may easily occur due to insignificant external influences. In order to account for the effect of impedance mismatching, Equation 1 may be rewritten as the following Equation 3:

$$\frac{\Delta f}{f_0} = \frac{\sqrt{VSWR} - 1}{Q_t\sqrt{VSWR}} \quad (3)$$

In an example in which an unbalanced relationship of a resonance bandwidth or a bandwidth of an impedance matching frequency between the source resonator 116 and the target resonator 121 is maintained, a reduction in an efficiency of the wireless power transmission may be prevented due to a change in the coupling coefficient κ, a change in the distance between the source resonator 116 and the target resonator 121, a change in the resonance impedance, impedance mismatching, and any other factor affecting the efficiency of the wireless power transmission.

According to Equation 1 through Equation 3, when the resonance bandwidth between the source resonator 116 and the target resonator 121 or the bandwidth of an impedance-matching frequency remains unbalanced, the Q-factor of the source resonator 116 and the Q-factor of the target resonator 121 may remain unbalanced.

In the following description, the term "resonator" used in the discussion of FIGS. 2A through 4B refers to both a source resonator and a target resonator.

Figure 2A:
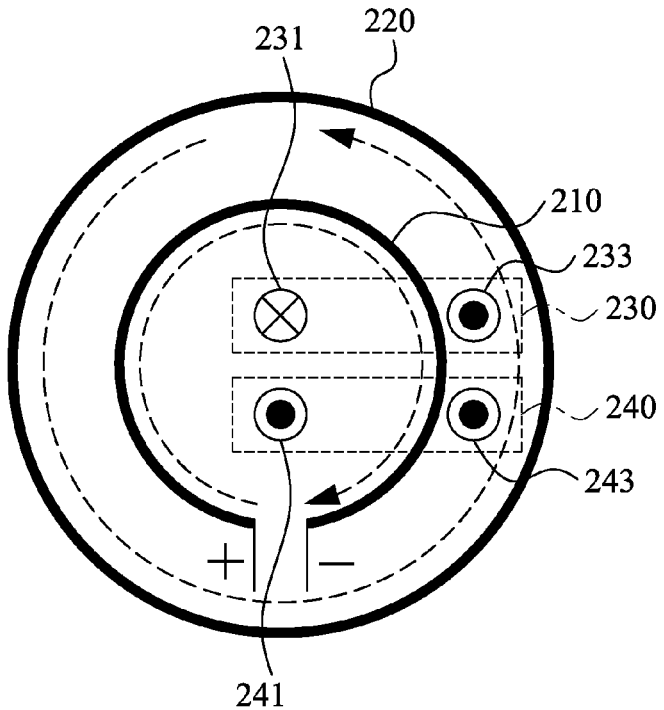
FIGS. 2A and 2B are diagrams illustrating examples of a distribution of a magnetic field in a feeder and a resonator of a wireless power transmitter.
Figure 2B:
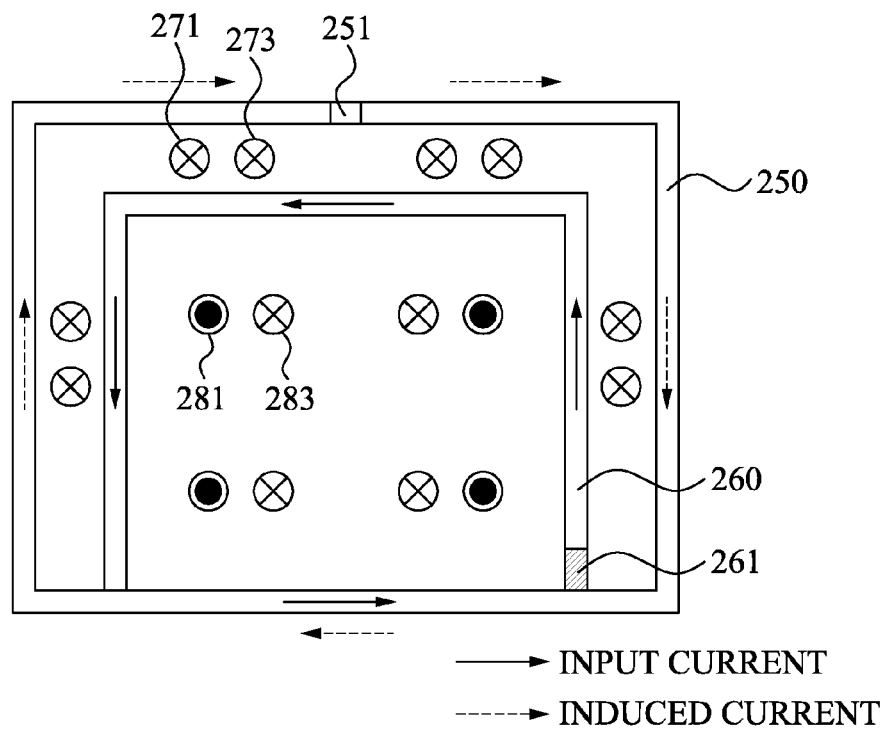

FIGS. 2A and 2B are diagrams illustrating examples of a distribution of a magnetic field in a feeder and a resonator of a wireless power transmitter. When a resonator receives power supplied through a separate feeder, magnetic fields are formed in both the feeder and the resonator.

FIG. 2A illustrates an example of a structure of a wireless power transmitter in which a feeder 210 and a resonator 220 do not have a common ground. Referring to FIG. 2A, as an input current flows into a feeder 210 through a terminal labeled "+" and out of the feeder 210 through a terminal labeled "−", a magnetic field 230 is formed by the input current. A direction 231 of the magnetic field 230 inside the feeder 210 is into the plane of FIG. 2A, and has a phase that is opposite to a phase of a direction 233 of the magnetic field 230 outside the feeder 210. The magnetic field 230 formed by the feeder 210 induces a current to flow in a resonator 220. The direction of the induced current in the resonator 220 is opposite to a direction of the input current in the feeder 210 as indicated by the dashed arrows in FIG. 2A.

The induced current in the resonator 220 forms a magnetic field 240. Directions of the magnetic field 240 are the same at all positions inside the resonator 220. Accordingly, a direction 241 of the magnetic field 240 formed by the resonator 220 inside the feeder 210 has the same phase as a direction 243 of the magnetic field 240 formed by the resonator 220 outside the feeder 210.

Consequently, when the magnetic field 230 formed by the feeder 210 and the magnetic field 240 formed by the resonator 220 are combined, a strength of the total magnetic field inside the resonator 220 decreases inside the feeder 210 and increases outside the feeder 210. In an example in which power is supplied to the resonator 220 through the feeder 210 configured as illustrated in FIG. 2A, the strength of the total magnetic field decreases in the center of the resonator 220, but increases outside the resonator 220. In another example in which a magnetic field is randomly distributed in the resonator 220, it is difficult to perform impedance matching since an input impedance will frequently vary. Additionally, when the strength of the total magnetic field increases, an efficiency of wireless power transmission increases. Conversely, when the strength of the total magnetic field is decreases, the efficiency of wireless power transmission decreases. Accordingly, the power transmission efficiency may be reduced on average.

FIG. 2B illustrates an example of a structure of a wireless power transmitter in which a resonator 250 and a feeder 260 have a common ground. The resonator 250 includes a capacitor 251. The feeder 260 receives a radio frequency (RF) signal via a port 261. When the RF signal is input to the feeder 260, an input current is generated in the feeder 260. The input current flowing in the feeder 260 forms a magnetic field, and a current is induced in the resonator 250 by the magnetic field. Additionally, another magnetic field is formed by the induced current flowing in the resonator 250. In this example, a direction of the input current flowing in the feeder 260 has a phase opposite to a phase of a direction of the induced current flowing in the resonator 250. Accordingly, in a region between the resonator 250 and the feeder 260, a direction 271 of the magnetic field formed by the input current has the same phase as a direction 273 of the magnetic field formed by the induced current, and thus the strength of the total magnetic field increases in the region between the resonator 250 and the feeder 260. Conversely, inside the feeder 260, a direction 281 of the magnetic field formed by the input current has a phase opposite to a phase of a direction 283 of the magnetic field formed by the induced current, and thus the strength of the total magnetic field decreases inside the feeder 260. Therefore, the strength of the total magnetic field decreases in the center of the resonator 250, but increases outside the resonator 250.

An input impedance may be adjusted by adjusting an internal area of the feeder 260. The input impedance refers to an impedance viewed in a direction from the feeder 260 to the resonator 250. When the internal area of the feeder 260 is increased, the input impedance is increased. Conversely, when the internal area of the feeder 260 is decreased, the input impedance is decreased. Because the magnetic field is randomly distributed in the resonator 250 despite a reduction in the input impedance, a value of the input impedance may vary based on a location of a target device. Accordingly, a separate matching network may be required to match the input impedance to an output impedance of a power amplifier. For example, when the input impedance is increased, a separate matching network may be used to match the increased input impedance to a relatively low output impedance of the power amplifier.

Figure 3A:
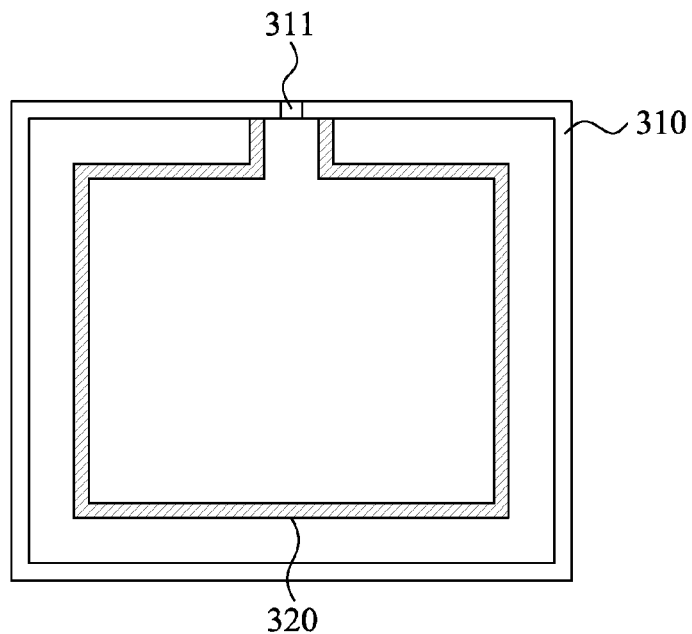
FIGS. 3A and 3B are diagrams illustrating an example of a feeding unit and a resonator of a wireless power transmitter.
Figure 3B:
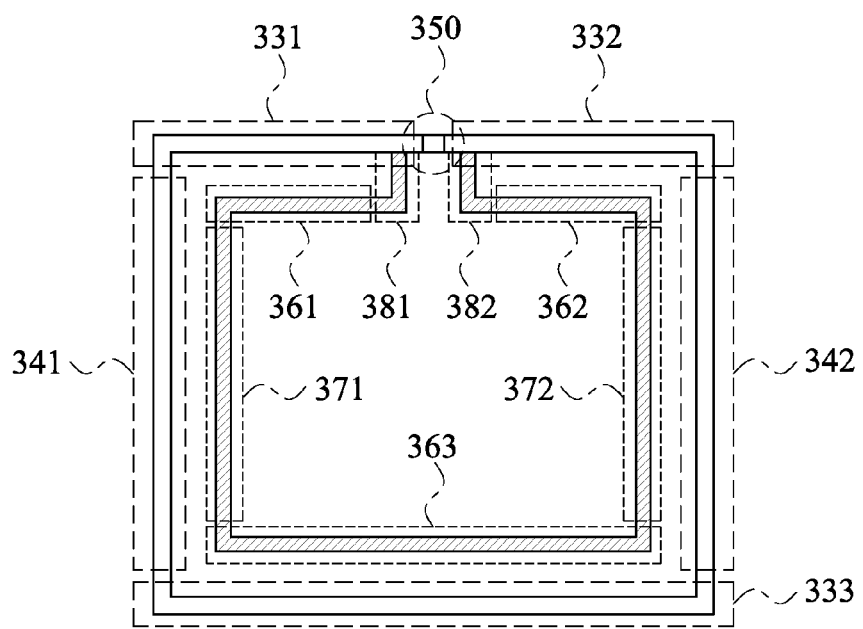

FIGS. 3A and 3B are diagrams illustrating an example of a feeding unit and a resonator of a wireless power transmitter. Referring to FIG. 3A, the wireless power transmitter includes a resonator 310 and a feeding unit 320. The resonator 310 further includes a capacitor 311. The feeding unit 320 is electrically connected to both ends of the capacitor 311.

FIG. 3B illustrates, in greater detail, a structure of the wireless power transmitter of FIG. 3A. The resonator 310 includes a first transmission line (not identified by a reference numeral in FIG. 3B, but formed by various elements in FIG. 3B as discussed below), a first conductor 341, a second conductor 342, and at least one capacitor 350.

The capacitor 350 is inserted in series between a first signal conducting portion 331 and a second signal conducting portion 332, causing an electric field to be confined within the capacitor 350. Generally, a transmission line includes at least one conductor in an upper portion of the transmission line, and at least one conductor in a lower portion of first transmission line. A current may flow through the at least one conductor disposed in the upper portion of the first transmission line, and the at least one conductor disposed in the lower portion of the first transmission line may be electrically grounded. In this example, a conductor disposed in an upper portion of the first transmission line in FIG. 3B is separated into two portions that will be referred to as the first signal conducting portion 331 and the second signal conducting portion 332. A conductor disposed in a lower portion of the first transmission line in FIG. 3B will be referred to as a first ground conducting portion 333.

As illustrated in FIG. 3B, the resonator 310 has a generally two-dimensional (2D) structure. The first transmission line includes the first signal conducting portion 331 and the second signal conducting portion 332 in the upper portion of the first transmission line, and includes the first ground conducting portion 333 in the lower portion of the first transmission line. The first signal conducting portion 331 and the second signal conducting portion 332 are disposed to face the first ground conducting portion 333. A current flows through the first signal conducting portion 331 and the second signal conducting portion 332.

One end of the first signal conducting portion 331 is connected to one end of the first conductor 341, the other end of the first signal conducting portion 331 is connected to the capacitor 350, and the other end of the first conductor 341 is connected to one end of the first ground conducting portion 333. One end of the second signal conducting portion 332 is connected to one end of the second conductor 342, the other end of the second signal conducting portion 332 is connected to the other end of the capacitor 350, and the other end of the second conductor 342 is connected to the other end of the ground conducting portion 333. Accordingly, the first signal conducting portion 331, the second signal conducting portion 332, the first ground conducting portion 333, the first conductor 341, and the second conductor 342 are connected to each other, causing the resonator 310 to have an electrically closed loop structure. The term "loop structure" includes a polygonal structure, a circular structure, a rectangular structure, and any other geometrical structure that is closed, i.e., that does not have any opening in its perimeter. The expression "having a loop structure" indicates a structure that is electrically closed.

The capacitor 350 is inserted into an intermediate portion of the first transmission line. In the example in FIG. 3B, the capacitor 350 is inserted into a space between the first signal conducting portion 331 and the second signal conducting portion 332. The capacitor 350 may be a lumped element capacitor, a distributed capacitor, or any other type of capacitor known to one of ordinary skill in the art. For example, a distributed element capacitor may include a zigzagged conductor line and a dielectric material having a relatively high permittivity disposed between parallel portions of the zigzagged conductor line.

The capacitor 350 inserted into the first transmission line may cause the resonator 310 to have a characteristic of a metamaterial. A metamaterial is a material having a predetermined electrical property that is not found in nature, and thus may have an artificially designed structure. All materials existing in nature have a magnetic permeability and permittivity. Most materials have a positive magnetic permeability and/or a positive permittivity.

For most materials, a right-hand rule may be applied to an electric field, a magnetic field, and a Poynting vector of the materials, so the materials may be referred to as right-handed materials (RHMs). However, a metamaterial that has a magnetic permeability and/or a permittivity that is not found in nature, and may be classified into an epsilon negative (ENG) material, a mu negative (MNG) material, a double negative (DNG) material, a negative refractive index (NRI) material, a left-handed (LH) material, and other metamaterial classifications known to one of ordinary skill in the art based on a sign of the magnetic permeability of the metamaterial and a sign of the permittivity of the metamaterial.

If the capacitor 350 is a lumped element capacitor and a capacitance of the capacitor 350 is appropriately determined, the resonator 310 may have a characteristic of a metamaterial. If the resonator 310 is caused to have a negative magnetic permeability by appropriately adjusting the capacitance of the capacitor 350, the resonator 310 may also be referred to as an MNG resonator. Various criteria may be applied to determine the capacitance of the capacitor 350. For example, the various criteria may include a criterion for enabling the resonator 310 to have the characteristic of the metamaterial, a criterion for enabling the resonator 310 to have a negative magnetic permeability at a target frequency, a criterion for enabling the resonator 310 to have a zeroth order resonance characteristic at the target frequency, and any other suitable criterion. Based on any one or any combination of the aforementioned criteria, the capacitance of the capacitor 350 may be appropriately determined.

The resonator 310, hereinafter referred to as the MNG resonator 310, may have a zeroth order resonance characteristic of having a resonance frequency when a propagation constant is "0". If the MNG resonator 310 has the zeroth order resonance characteristic, the resonance frequency is independent of a physical size of the MNG resonator 310. By changing the capacitance of the capacitor 350, the resonance frequency of the MNG resonator 310 may be changed without changing the physical size of the MNG resonator 310.

In a near field, the electric field is concentrated in the capacitor 350 inserted into the first transmission line, causing the magnetic field to become dominant in the near field. The MNG resonator 310 has a relatively high Q-factor when the capacitor 350 is a lumped element, thereby increasing a power transmission efficiency. The Q-factor indicates a level of an ohmic loss or a ratio of a reactance with respect to a resistance in the wireless power transmission. As will be understood by one of ordinary skill in the art, the efficiency of the wireless power transmission will increase as the Q-factor increases.

Although not illustrated in FIG. 3B, a magnetic core passing through the MNG resonator 310 may be provided to increase a power transmission distance.

Referring to FIG. 3B, the feeding unit 320 includes a second transmission line (not identified by a reference numeral in FIG. 3B, but formed by various elements in FIG. 3B as discussed below), a third conductor 371, a fourth conductor 372, a fifth conductor 381, and a sixth conductor 382.

The second transmission line includes a third signal conducting portion 361 and a fourth signal conducting portion 362 in an upper portion of the second transmission line, and includes a second ground conducting portion 363 in a lower portion of the second transmission line. The third signal conducting portion 361 and the fourth signal conducting portion 362 are disposed to face the second ground conducting portion 363. A current flows through the third signal conducting portion 361 and the fourth signal conducting portion 362.

One end of the third signal conducting portion 361 is connected to one end of the third conductor 371, the other end of the third signal conducting portion 361 is connected to one end of the fifth conductor 381, and the other end of the third conductor 371 is connected to one end of the second ground conducting portion 363. One end of the fourth signal conducting portion 362 is connected to one end of the fourth conductor 372, the other end of the fourth signal conducting portion 362 is connected to one end the sixth conductor 382, and the other end of the fourth conductor 372 is connected to the other end of the second ground conducting portion 363. The other end of the fifth conductor 381 is connected to the first signal conducting portion 331 at or near where the first signal conducting portion 331 is connected to one end of the capacitor 350, and the other end of the sixth conductor 382 is connected to the second signal conducting portion 332 at or near where the second signal conducting portion 332 is connected to the other end of the capacitor 350. Thus, the fifth conductor 381 and the sixth conductor 382 are connected in parallel to both ends of the capacitor 350. The fifth conductor 381 and the sixth conductor 382 are used as an input port to receive an RF signal as an input.

Accordingly, the third signal conducting portion 361, the fourth signal conducting portion 362, the second ground conducting portion 363, the third conductor 371, the fourth conductor 372, the fifth conductor 381, the sixth conductor 382, and the resonator 310 are connected to each other, causing the resonator 310 and the feeding unit 320 to have an electrically closed loop structure. The term "loop structure" includes a polygonal structure, a circular structure, a rectangular structure, and any other geometrical structure that is closed, i.e., that does not have any opening in its perimeter. The expression "having a loop structure" indicates a structure that is electrically closed.

If an RF signal is input to the fifth conductor 381 or the sixth conductor 382, input current flows through the feeding unit 320 and the resonator 310, generating a magnetic field that induces a current in the resonator 310. A direction of the input current flowing through the feeding unit 320 is identical to a direction of the induced current flowing through the resonator 310, thereby causing a strength of a total magnetic field to increase in the center of the resonator 310, and decrease near the outer periphery of the resonator 310.

An input impedance is determined by an area of a region between the resonator 310 and the feeding unit 320. Accordingly, a separate matching network used to match the input impedance to an output impedance of a power amplifier may not be necessary. However, if a matching network is used, the input impedance may be adjusted by adjusting a size of the feeding unit 320, and accordingly a structure of the matching network may be simplified. The simplified structure of the matching network may reduce a matching loss of the matching network.

The second transmission line, the third conductor 371, the fourth conductor 372, the fifth conductor 381, and the sixth conductor 382 of the feeding unit may have a structure identical to the structure of the resonator 310. For example, if the resonator 310 has a loop structure, the feeding unit 320 may also have a loop structure. As another example, if the resonator 310 has a circular structure, the feeding unit 320 may also have a circular structure.

Figure 4A:
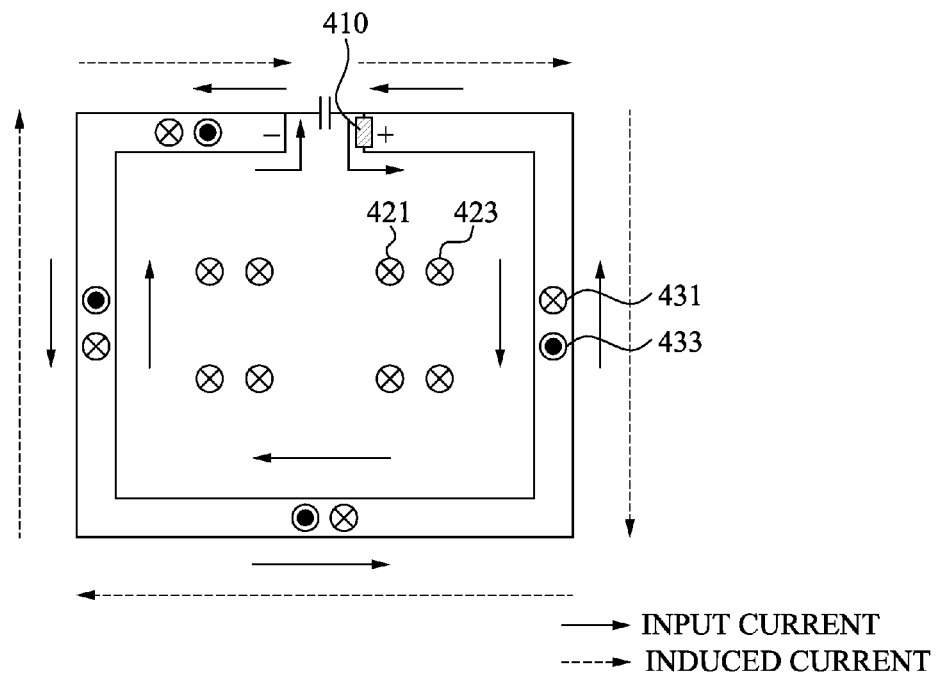
FIG. 4A is a diagram illustrating an example of a distribution of a magnetic field in a resonator that is produced by feeding of a feeding unit, of a wireless power transmitter.

FIG. 4A is a diagram illustrating an example of a distribution of a magnetic field in a resonator that is produced by feeding of a feeding unit, of a wireless power transmitter. FIG. 4A more simply illustrates the resonator 310 and the feeding unit 320 of FIGS. 3A and 3B, and the names of the various elements in FIG. 3B will be used in the following description of FIG. 4A without reference numerals.

A feeding operation may be an operation of supplying power to a resonator in wireless power transmission, or an operation of supplying AC power to a rectification unit in wireless power transmission. FIG. 4A illustrates a direction of input current flowing in the feeding unit, and a direction of induced current flowing in the resonator. Additionally, FIG. 4A illustrates a direction of a magnetic field formed by the input current of the feeding unit, and a direction of a magnetic field formed by the induced current of the resonator.

Referring to FIG. 4A, the fifth conductor or the sixth conductor of the feeding unit 320 may be used as an input port 410. In FIG. 4A, the sixth conductor of the feeding unit is being used as the input port 410. An RF signal is input to the input port 410. The RF signal may be output from a power amplifier. The power amplifier may increase and decrease an amplitude of the RF signal based on a power requirement of a target device. The RF signal input to the input port 410 is represented in FIG. 4A as an input current flowing in the feeding unit. The input current flows in a clockwise direction in the feeding unit along the second transmission line of the feeding unit. The fifth conductor and the sixth conductor of the feeding unit are electrically connected to the resonator. More specifically, the fifth conductor of the feeding unit is connected to the first signal conducting portion of the resonator, and the sixth conductor of the feeding unit is connected to the second signal conducting portion of the resonator. Accordingly, the input current flows in both the resonator and the feeding unit. The input current flows in a counterclockwise direction in the resonator along the first transmission line of the resonator. The input current flowing in the resonator generates a magnetic field, and the magnetic field induces a current in the resonator due to the magnetic field. The induced current flows in a clockwise direction in the resonator along the first transmission line of the resonator. The induced current in the resonator transfers energy to the capacitor of the resonator, and also generates a magnetic field. In FIG. 4A, the input current flowing in the feeding unit and the resonator is indicated by solid lines with arrowheads, and the induced current flowing in the resonator is indicated by dashed lines with arrowheads.

A direction of a magnetic field generated by a current is determined based on the right-hand rule. As illustrated in FIG. 4A, within the feeding unit, a direction 421 of the magnetic field generated by the input current flowing in the feeding unit is identical to a direction 423 of the magnetic field generated by the induced current flowing in the resonator. Accordingly, a strength of the total magnetic field may increases inside the feeding unit.

In contrast, as illustrated in FIG. 4A, in a region between the feeding unit and the resonator, a direction 433 of the magnetic field generated by the input current flowing in the feeding unit is opposite to a direction 431 of the magnetic field generated by the induced current flowing in the resonator. Accordingly, the strength of the total magnetic field decreases in the region between the feeding unit and the resonator.

Typically, in a resonator having a loop structure, a strength of a magnetic field decreases in the center of the resonator, and increases near an outer periphery of the resonator. However, referring to FIG. 4A, since the feeding unit is electrically connected to both ends of the capacitor of the resonator, the direction of the induced current in the resonator is identical to the direction of the input current in the feeding unit. Since the direction of the induced current in the resonator is identical to the direction of the input current in the feeding unit, the strength of the total magnetic field increases inside the feeding unit, and decreases outside the feeding unit. As a result, due to the feeding unit, the strength of the total magnetic field increases in the center of the resonator having the loop structure, and decreases near an outer periphery of the resonator, thereby compensating for the normal characteristic of the resonator having the loop structure in which the strength of the magnetic field decreases in the center of the resonator, and increases near the outer periphery of the resonator. Thus, the strength of the total magnetic field may be constant inside the resonator.

A power transmission efficiency for transferring wireless power from a source resonator to a target resonator is proportional to the strength of the total magnetic field generated in the source resonator. Accordingly, when the strength of the total magnetic field increases inside the source resonator, the power transmission efficiency also increases.

Figure 4B:
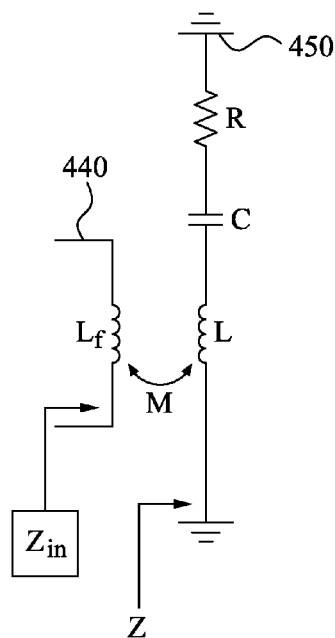
FIG. 4B is a diagram illustrating examples of equivalent circuits of a feeding unit and a resonator of a wireless power transmitter.

FIG. 4B is a diagram illustrating examples of equivalent circuits of a feeding unit and a resonator of a wireless power transmitter. Referring to FIG. 4B, a feeding unit 440 and a resonator 450 may be represented by the equivalent circuits in FIG. 4B. The feeding unit 440 is represented as an inductor having an inductance $L_f$, and the resonator 450 is represented as a series connection of an inductor having an inductance L coupled to the inductance $L_f$ of the feeding unit 440 by a mutual inductance M, a capacitor having a capacitance C, and a resistor having a resistance R. An example of an input impedance $Z_{in}$ viewed in a direction from the feeding unit 440 to the resonator 450 may be expressed by the following Equation 4:

$$Z_{in} = \frac{(\omega M)^2}{Z} \quad (4)$$

In Equation 4, M denotes a mutual inductance between the feeding unit 440 and the resonator 450, ω denotes a resonance frequency of the feeding unit 440 and the resonator 450, and Z denotes an impedance viewed in a direction from the resonator 450 to a target device. As can be seen from Equation 4, the input impedance $Z_{in}$ is proportional to the square of the mutual inductance M. Accordingly, the input impedance $Z_{in}$ may be adjusted by adjusting the mutual inductance M. The mutual inductance M depends on an area of a region between the feeding unit 440 and the resonator 450. The area of the region between the feeding unit 440 and the resonator 450 may be adjusted by adjusting a size of the feeding unit 440, thereby adjusting the mutual inductance M and the input impedance $Z_{in}$. Since the input impedance $Z_{in}$ may be adjusted by adjusting the size of the feeding unit 440, it may be unnecessary to use a separate matching network to perform impedance matching with an output impedance of a power amplifier.

In a target resonator and a feeding unit included in a wireless power receiver, a magnetic field may be distributed as illustrated in FIG. 4A. For example, the target resonator may receive wireless power from a source resonator via magnetic coupling. The received wireless power induces a current in the target resonator. The induced current in the target resonator generates a magnetic field, which induces a current in the feeding unit. If the target resonator is connected to the feeding unit as illustrated in FIG. 4A, a direction of the induced current flowing in the target resonator will be identical to a direction of the induced current flowing in the feeding unit. Accordingly, for the reasons discussed above in connection with FIG. 4A, a strength of the total magnetic field will increase inside the feeding unit, and will decrease in a region between the feeding unit and the target resonator.

Figure 5:
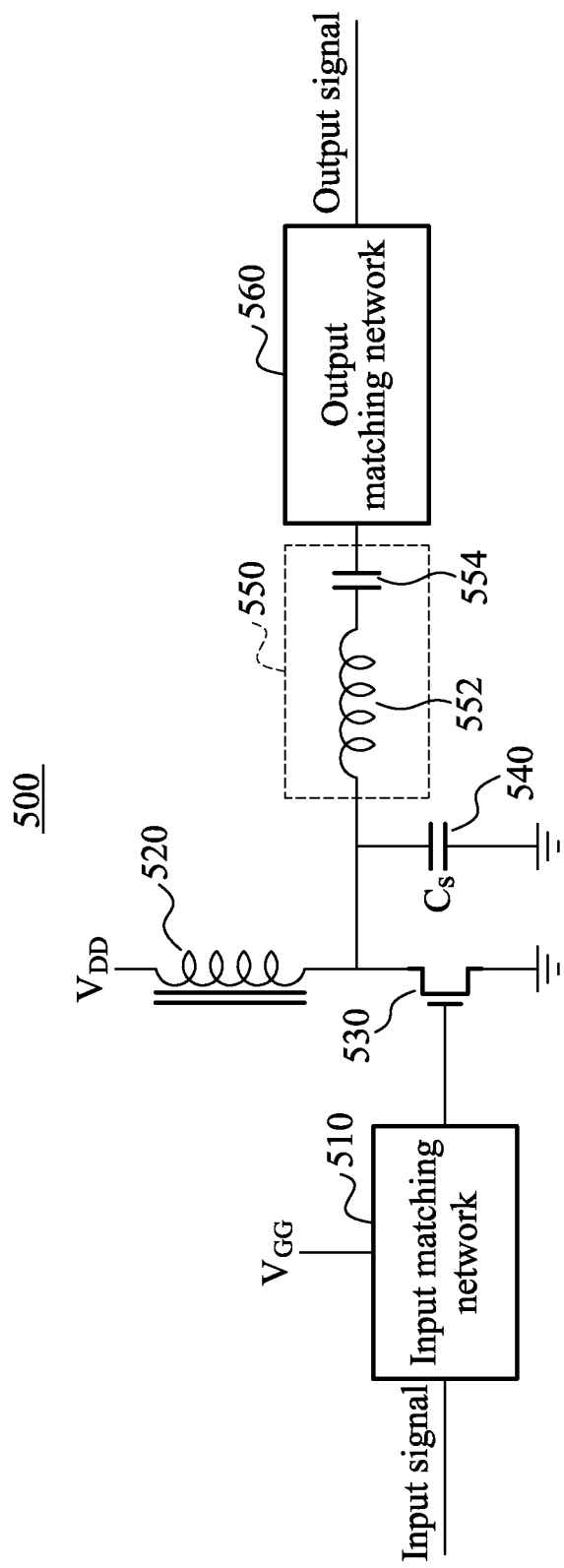
FIG. 5 is a circuit diagram illustrating an example of a class-E amplifier.

FIG. 5 is a circuit diagram illustrating an example of a class-E amplifier 500. Referring to FIG. 5, the class-E amplifier 500 includes an input matching network 510, an inductor 520, a transistor 530, a capacitor $C_S$ 540, a resonant circuit 550, and an output matching network 560.

The input matching network 510 receives an input signal. A voltage $V_{GG}$ is applied to the input matching network 510. The voltage $V_{GG}$ denotes a voltage to be applied to a gate of the transistor 530. The input matching network 510 matches an impedance between a circuit providing the input signal, and a circuit receiving a signal output from the input matching network 510. An output terminal of the input matching network 510 is connected to the gate of the transistor 530. The input matching network 510 outputs the signal to the gate of the transistor 530, to switch the transistor 530 ON and OFF.

The inductor 520 may include an RF choke inductor. A voltage $V_{DD}$ is applied to an end of the inductor 520. The voltage $V_{DD}$ denotes a voltage applied to a drain of the transistor 530. The inductor 520 prevents an AC signal of the drain of the transistor 530 from flowing through a circuit providing the voltage $V_{DD}$, and allows a DC signal of the voltage $V_{DD}$ to flow into the drain of the transistor 530. Another end of the inductor 520 is connected to the drain of the transistor 530.

The transistor 530 may include a field effect transistor (FET), and includes a source, the gate, and the drain. The source of the transistor 530 is connected to ground.

An end of the capacitor Cs 540 is connected to the drain of the transistor 530, and another end of the capacitor $C_S$ is connected to the ground. The capacitor $C_S$ 540 accumulates and releases a charge when the transistor 530 is switched ON and OFF, respectively.

The resonant circuit 550 receives signals from the drain of the transistor 530. The resonant circuit 550 passes a signal of a predetermined frequency, among the signals received from the drain of the transistor 530. In other words, the resonant circuit 550 corresponds to a filter with respect to the signals input into the resonant circuit 550. The resonant circuit 550 outputs the signal of the predetermined frequency to the output matching network 560.

In more detail, the resonant circuit 550 includes a series resonant circuit in which an inductor 552 and a capacitor 554 are connected in series. An end of the inductor 552 receives the signals from the drain of the transistor 530. Another end of the inductor 552 is connected to an end of the capacitor 554. Another end of the capacitor 554 is connected to the output matching network 560.

The output matching network 560 receives the signal of the predetermined frequency from the resonant circuit 550. The output matching network 560 matches an impedance between the resonant circuit 550 providing the signal of the predetermined frequency, and a circuit receiving an output signal output from the output matching network 560. The output matching network 560 outputs the output signal to the circuit.

A series resonant circuit on a side of an output end of the class-E amplifier 500 that includes the capacitor $C_S$ 540, the inductor 552, and the capacitor 554, may generate waveforms of a voltage and a current to be in ideal waveforms. Accordingly, the class-E amplifier 500 may include a high efficiency of 100%.

The class-E amplifier 500 may be single-ended. Accordingly, the class-E amplifier 500 may include a characteristic change, which may be sensitive to a change in conditions of a load. The load may include a circuit or a device to which the output signal is provided. The change in the conditions of the load may include a change in an impedance of the load.

Figure 6:
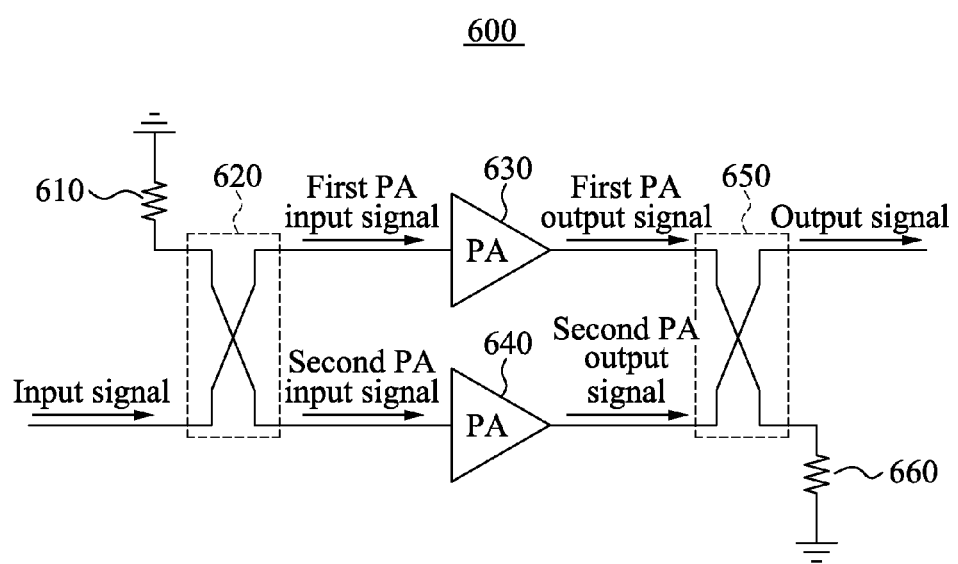
FIG. 6 is a circuit diagram illustrating an example of an amplifier using a 90° hybrid splitter and a 90° hybrid combiner.

FIG. 6 is a circuit diagram illustrating an example of an amplifier 600 using a 90° hybrid splitter 620 and a 90° hybrid combiner 650. The amplifier 600 may correspond to the power converter 114 of FIG. 1, or may correspond to a portion of the power converter 114. Referring to FIG. 6, the amplifier 600 includes a first resistor 610, the 90° hybrid splitter 620, a first PA 630, a second PA 640, the 90° hybrid combiner 650, and a second resistor 660. The amplifier 600 includes a balanced amplifier in which the 90° hybrid splitter 620 is disposed on an input side of the amplifier 600, the 90° hybrid combiner 650 is disposed on an output side of the amplifier 600, and two power amplifiers (e.g., the first PA 630 and the second PA 640) are combined.

The 90° hybrid splitter 620 splits an input signal into two PA input signals including a 90° phase difference and an identical magnitude. The two PA input signals include a first PA input signal and a second PA input signal.

The first PA 630 amplifies the first PA input signal to generate and output a first PA output signal. The second PA 640 amplifies the second PA input signal to generate and output a second PA output signal.

The 90° hybrid combiner 650 combines the first PA output signal and the second PA output signal, including a 90° phase difference, to be in phase, to generate and output an output signal.

Each of the 90° hybrid splitter 620 and the 90° hybrid combiner 650 may include a first port, a second port, a third port, and a fourth port.

The first port of the 90° hybrid splitter 620 is connected to an end of the first resistor 610. Another end of the first resistor 610 is connected to the ground. The third port of the 90° hybrid splitter 620 is connected to a circuit providing the input signal, and receives the input signal from the circuit. The second port of the 90° hybrid splitter 620 is connected to an input end of the first PA 630, and outputs the first PA input signal to the input end of the first PA 630. The fourth port of the 90° hybrid splitter 620 is connected to an input end of the second PA 640, and outputs the second PA input signal to the input end of the second PA 640.

The first port of the 90° hybrid combiner 650 is connected to an output end of the first PA 630, and receives the first PA output signal from the output end of the first PA 630. The third port of the 90° hybrid combiner 650 is connected to an output end of the second PA 640, and receives the second PA output signal from the output end of the second PA 640. The second port of the 90° hybrid combiner 650 is connected to a circuit receiving the output signal, and outputs the output signal to the circuit. The fourth port of the 90° hybrid combiner 650 is connected to an end of the second resistor 660. Another end of the second resistor 660 is connected to the ground.

A few schemes may be used to configure the 90° hybrid splitter 620 and the 90° hybrid combiner 650. For example, the 90° hybrid splitter 620 and the 90° hybrid combiner 650 may be configured using a transmission line directly, or using a coupled transmission line. The transmission line may include a line that a wave passes through, and the wave may include an AC signal. However, when the 90° hybrid splitter 620 and the 90° hybrid combiner 650 are configured using the transmission line or the coupled transmission line, a form factor of the 90° hybrid splitter 620 and a form factor of the 90° hybrid combiner 650 may increase as a frequency of an application decreases. The application frequency may include a resonance frequency.

Figure 7:
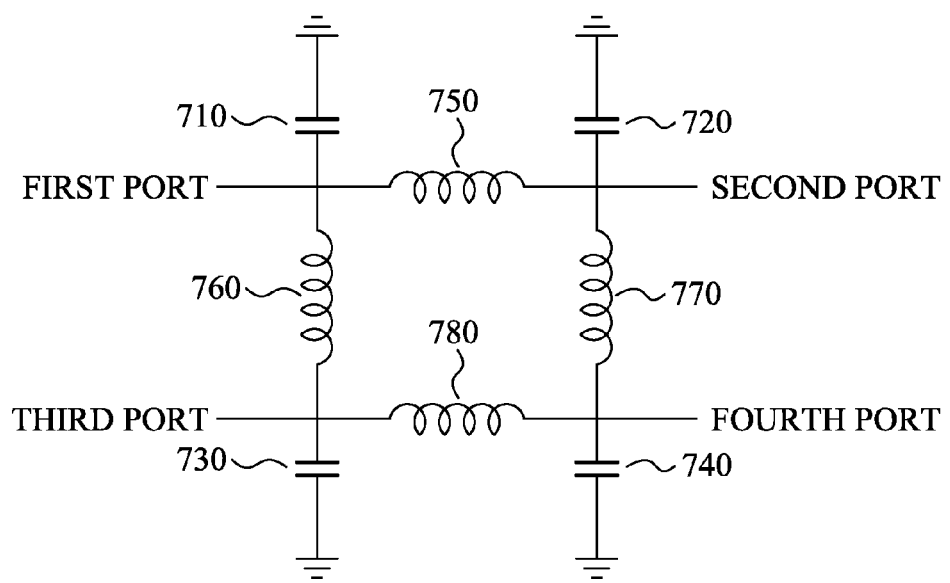
FIG. 7 is a circuit diagram illustrating an example of a 90° hybrid splitter or a 90° hybrid combiner.

FIG. 7 is a circuit diagram illustrating an example of a 90° hybrid splitter or a 90° hybrid combiner. Referring to FIG. 7, a circuit 700 may correspond to the 90° hybrid splitter 620 or the 90° hybrid combiner 650 of FIG. 6. The circuit 700 includes a first capacitor 710, a second capacitor 720, a third capacitor 730, and a fourth capacitor 740. The circuit 700 further includes a first inductor 750, a second inductor 760, a third inductor 770, and a fourth inductor 780.

The circuit 700 includes a branch-line coupler using a lumped component. Four ports of the circuit 700, that is, a first port, a second port, a third port, and a fourth port, are connected to one another. Pairs of the ports, that is, pairs of the first port, the second port, the third port, and the fourth port, are connected to each other using respective quarter-wave transmission lines.

Each of the quarter-wave transmission lines forms a C-L-C network including a front capacitor, an inductor, and a rear capacitor. The C-L-C network may include a low-pass C-L-C network. The front capacitor and the rear capacitor may include identical capacitances and are connected to a port in parallel, and the inductor is connected to the port in series. For example, a first quarter-wave transmission line between the first port and the second port includes the first capacitor 710, the first inductor 750, and the second capacitor 720. The first capacitor 710 and the second capacitor 720 may include identical capacitances and are connected to the first port and the second port in parallel, and the first inductor 750 is connected to the first port and the second port in series.

In more detail, an end of the first capacitor 710, an end of the first inductor 750, and an end of the second inductor 760 are connected to the first port. Another end of the first capacitor 710 is connected to the ground.

An end of the second capacitor 720, another end of the first inductor 750, and an end of the third inductor 770 are connected to the second port. Another end of the second capacitor 720 is connected to the ground.

An of the third capacitor 730, another end of the second inductor 760, and an end of the fourth inductor 780 are connected to the third port. Another end of the third capacitor 730 is connected to the ground.

An end of the fourth capacitor 740, another end of the third inductor 770, and another end of the fourth inductor 780 are connected to the fourth port. Another end of the fourth capacitor 740 is connected to the ground.

A first quarter-wave transmission line between the first port and the second port includes the first capacitor 710 that is connected to the first quarter-wave transmission line in parallel, the first inductor 750 that is connected to the first quarter-wave transmission line in series, and the second capacitor 720 that is connected to the first quarter-wave transmission line in parallel. A second quarter-wave transmission line between the first port and the third port includes the first capacitor 710 that is connected to the second quarter-wave transmission line in parallel, the second inductor 760 that is connected to the second quarter-wave transmission line in series, and the third capacitor 730 that is connected to the second quarter-wave transmission line in parallel. A third quarter-wave transmission line between the second port and the fourth port includes the second capacitor 720 that is connected to the third quarter-wave transmission line in parallel, the third inductor 770 that is connected to the third quarter-wave transmission line in series, and the fourth capacitor 740 that is connected to the third quarter-wave transmission line in parallel. A fourth quarter-wave transmission line between the third port and the fourth port includes the third capacitor 730 that is connected to the fourth quarter-wave transmission line in parallel, the fourth inductor 780 that is connected to the fourth quarter-wave transmission line in series, and the fourth capacitor 740 that is connected to the fourth quarter-wave transmission line in parallel.

A common capacitor that is connected to two of the quarter-wave transmission lines may be divided into two sub-capacitors. The two sub-capacitors may be included in the two quarter-wave transmission lines, respectively. For example, the first capacitor 710 may be divided into two sub-capacitors. The first capacitor 710 may correspond to a capacitor including a capacitance that is generated by connecting the two sub-capacitors in parallel. The two sub-capacitors may be included in the first quarter-wave transmission line and the second quarter-wave transmission line, respectively.

Figure 8:
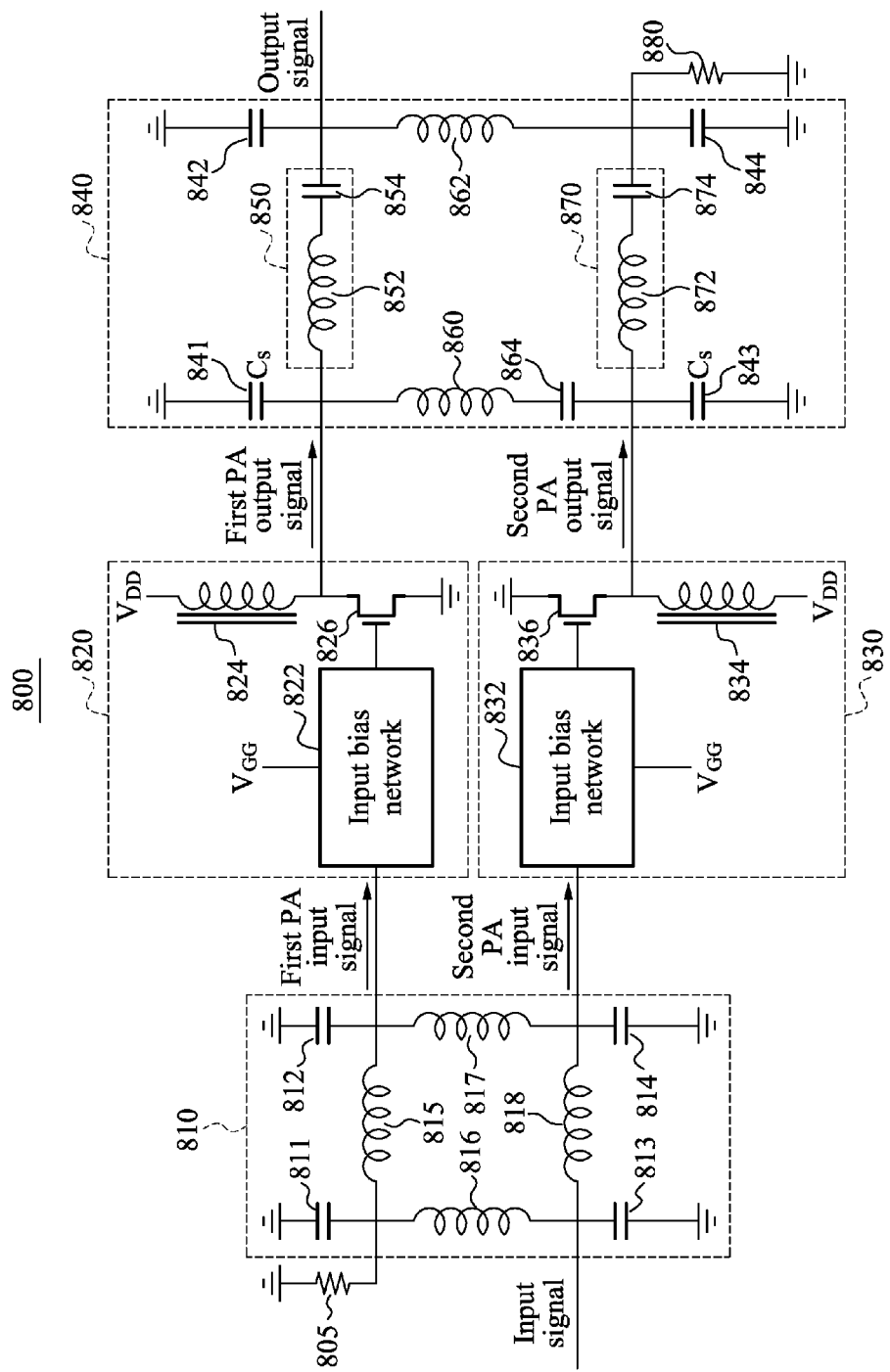
FIG. 8 is a circuit diagram illustrating an example of an amplifier.

FIG. 8 is a circuit diagram illustrating an example of an amplifier 800. The amplifier 800 may correspond to a power amplifier. The amplifier 800 may correspond to the power converter 114 of FIG. 1, or may correspond to a portion of the power converter 114. Referring to FIG. 8, the amplifier 800 includes a first resistor 805, a 90° hybrid splitter 810, a first PA 820, a second PA 830, a 90° hybrid combiner 840, and a second resistor 880.

The 90° hybrid splitter 810 splits an input signal into two PA input signals including a 90° phase difference. The two PA input signals include a first PA input signal and a second PA input signal.

In more detail, the 90° hybrid splitter 810 includes four ports. A first port of the 90° hybrid splitter 810 is connected to an end of the first resistor 805. Another end of the first resistor 805 is connected to the ground. A second port of the 90° hybrid splitter 810 is connected to an input end of the first PA 820, and outputs the first PA input signal to the input end of the first PA 820. A third port of the 90° hybrid splitter 810 is connected to a circuit providing the input signal, and receives the input signal from the circuit. A fourth port of the 90° hybrid splitter 810 is connected to an input end of the second PA 830, and outputs the second PA input signal to the input end of the second PA 830.

The input end of the first PA 820 is connected to the second port of the 90° hybrid splitter 810, and receives the first PA input signal from the second port of the 90° hybrid splitter 810. The first PA 820 amplifies the first PA input signal to generate and output a first PA output signal. An output end of the first PA 820 is connected to a first port of the 90° hybrid combiner 840, and outputs the first PA output signal to the first port of the 90° hybrid combiner 840.

The input end of the second PA 830 is connected to the fourth port of the 90° hybrid splitter 810, and receives the second PA input signal from the fourth port of the 90° hybrid splitter 810. The second PA 830 amplifies the second PA input signal to generate and output a second PA output signal. An output end of the second PA 830 is connected to a third port of the 90° hybrid combiner 840, and outputs the second PA output signal to the third port of the 90° hybrid combiner 840.

The 90° hybrid combiner 840 combines the first PA output signal and the second PA output signal, including a 90° phase difference, to be in phase, to generate and output an output signal.

In more detail, the 90° hybrid combiner 840 includes four ports. The first port of the 90° hybrid combiner 840 is connected to the output end of the first PA 820, and receives the first PA output signal from the output end of the first PA 820. A second port of the 90° hybrid combiner 840 is connected to a circuit receiving the output signal, and outputs the output signal to the circuit. The third port of the 90° hybrid combiner 840 is connected to the output end of the second PA 830, and receives the second PA output signal from the output end of the second PA 830. A fourth port of the 90° hybrid combiner 840 is connected to an end of the second resistor 880. Another end of the second resistor 880 is connected to the ground.

The amplifier 800 corresponds to a small balanced class-E amplifier that is configured by applying a branch-line splitter including a lumped component and a branch-line combiner including a lumped component, which are described with reference to FIG. 7, to the class-E amplifier 500 of FIG. 5. In other words, each of the 90° hybrid splitter 810 and the 90° hybrid combiner 840 may include the circuit 700 of FIG. 7.

In more detail, each of the 90° hybrid splitter 810 and the 90° hybrid combiner 840 includes a branch-line coupler using a lumped component, and uses quarter-wave transmission lines to connect respective pairs of ports. Each of the quarter-wave transmission lines forms a C-L-C network including a front capacitor, an inductor, and a rear capacitor. The front capacitor and the rear capacitor may include identical capacitances.

The 90° hybrid splitter 810 includes a first capacitor 811, a second capacitor 812, a third capacitor 813, a fourth capacitor 814, a first inductor 815, a second inductor 816, a third inductor 817, and a fourth inductor 818. The first capacitor 811, the second capacitor 812, the third capacitor 813, the fourth capacitor 814, the first inductor 815, the second inductor 816, the third inductor 817, and the fourth inductor 818 may correspond to the first capacitor 710, the second capacitor 720, the third capacitor 730, the fourth capacitor 740, the first inductor 750, the second inductor 760, the third inductor 770, and the fourth inductor 780 of the circuit 700 of FIG. 7, respectively. In addition, the first port, the second port, the third port, and the fourth port of the 90° hybrid splitter 810 may correspond to the first port, the second port, the third port, and the fourth port of the circuit 700, respectively. Accordingly, the descriptions about the circuit 700 provided with reference to FIG. 7 may be applied to the 90° hybrid splitter 810.

The first PA 820 includes an input bias network 822, an inductor 824, and a transistor 826. The input bias network 822, the inductor 824, and the transistor 826 may correspond to the input matching network 510, the inductor 520, and the transistor 530 of FIG. 5, respectively.

The input bias network 822 receives the first PA input signal from the second port of the 90° hybrid splitter 810. A voltage $V_{GG}$ is applied to the input bias network 822. The voltage $V_{GG}$ denotes a voltage to be applied to a gate of the transistor 826. An output terminal of the input bias network 822 is connected to the gate of the transistor 826. The input bias network 822 generates a bias signal based on the first PA input signal and the voltage $V_{GG}$, and outputs the bias signal to the gate of the transistor 826, to switch the transistor 826 ON and OFF.

The inductor 824 may include an RF choke inductor. A voltage $V_{DD}$ is applied to an end of the inductor 824. The voltage $V_{DD}$ denotes a voltage applied to the drain of the transistor 826. The inductor 824 prevents an AC signal of the drain of the transistor 826 from flowing through a circuit providing the voltage $V_{DD}$, and allows a DC signal of the voltage $V_{DD}$ to flow into the drain of the transistor 826. Another end of the inductor 824 is connected to the drain of the transistor 826.

The transistor 826 may include an FET, and includes a source, the gate, and the drain. The source of the transistor 826 is connected to the ground. The drain of the transistor 826 is connected to the first port of the 90° hybrid combiner 840, and outputs the first PA output signal to the first port of the 90° hybrid combiner 840.

The second PA 830 includes an input bias network 832, an inductor 834, and a transistor 836. The input bias network 832, the inductor 834, and the transistor 836 may correspond to the input matching network 510, the inductor 520, and the transistor 530 of FIG. 5, respectively.

The input bias network 832 receives the second PA input signal from the fourth port of the 90° hybrid splitter 810. The voltage $V_{GG}$ is applied to the input bias network 832. The voltage $V_{GG}$ denotes a voltage to be applied to a gate of the transistor 836. An output terminal of the input bias network 832 is connected to the gate of the transistor 836. The input bias network 832 generates a bias signal based on the second PA input signal and the voltage $V_{GG}$, and outputs the bias signal to the gate of the transistor 836, to switch the transistor 8360N and OFF.

The inductor 834 may include an RF choke inductor. The voltage $V_{DD}$ is applied to an end of the inductor 834. The voltage $V_{DD}$ denotes a voltage applied to the drain of the transistor 836. The inductor 834 prevents an AC signal of the drain of the transistor 836 from flowing through the circuit providing the voltage $V_{DD}$, and allows the DC signal of the voltage $V_{DD}$ to flow into the drain of the transistor 836. Another end of the inductor 834 is connected to the drain of the transistor 836.

The transistor 836 may include an FET, and includes a source, the gate, and the drain. The source of the transistor 836 is connected to the ground. The drain of the transistor 836 is connected to the third port of the 90° hybrid combiner 840, and outputs the second PA output signal to third port of the 90° hybrid combiner 840.

The 90° hybrid combiner 840 includes a first capacitor 841, a second capacitor 842, a third capacitor 843, a fourth capacitor 844, a first resonant circuit 850, a second resonant circuit 870, a second inductor 860, and a third inductor 862. The first resonant circuit 850 includes a first inductor 852, and a fifth capacitor 854. The second resonant circuit 870 includes a fourth inductor 872, and a sixth capacitor 874. The 90° hybrid combiner 840 further includes a seventh capacitor 864. The first capacitor 841, the second capacitor 842, the third capacitor 843, the fourth capacitor 844, the first inductor 852, the second inductor 860, the third inductor 862, and the fourth inductor 872 may correspond to the first capacitor 710, the second capacitor 720, the third capacitor 730, the fourth capacitor 740, the first inductor 750, the second inductor 760, the third inductor 770, and the fourth inductor 780 of the circuit 700 of FIG. 7, respectively. In addition, the first port, the second port, the third port, and the fourth port of the 90° hybrid combiner 840 may correspond to the first port, the second port, the third port, and the fourth port of the circuit 700, respectively. Accordingly, the descriptions about the circuit 700 provided with reference to FIG. 7 may be applied to the 90° hybrid combiner 840.

Each of the first capacitor 841 and the third capacitor 843 may perform the function of the capacitor Cs 540 of FIG. 5. That is, the first capacitor 841 connected to the first port of the 90° hybrid combiner 840 accumulates and releases a charge when the transistor 826 is switched ON and OFF, respectively. The third capacitor 843 connected to the third port of the 90° hybrid combiner 840 accumulates and releases a charge when the transistor 836 is switched ON and OFF, respectively.

The first resonant circuit 850 is disposed between the first port of the 90° hybrid combiner 840 and the second port of the 90° hybrid combiner 840. The second resonant circuit 870 is disposed between the third port of the 90° hybrid combiner 840 and the fourth port of the 90° hybrid combiner 840. The first resonant circuit 850 and the second resonant circuit 870 may be configured by changing the first inductor 750 and the fourth inductor 780, respectively, of FIG. 7.

The first resonant circuit 850 receives the first PA output signal from the drain of the transistor 826 of the first PA 820. The first resonant circuit 850 passes a signal of a predetermined frequency, among first PA output signals received from the drain of the transistor 826 of the first PA 820. In other words, the first resonant circuit 850 corresponds to a filter with respect to the first PA output signals input into the first resonant circuit 850. The first resonant circuit 850 outputs the signal of the predetermined frequency as the output signal.

In more detail, the first resonant circuit 850 includes a series resonant circuit in which the first inductor 852 and the fifth capacitor 854 are connected in series. An end of the first inductor 852 receives the first PA output signal from the drain of the transistor 826 of the first PA 820. Another end of the first inductor 852 is connected to an end of the fifth capacitor 854. Another end of the fifth capacitor 854 is connected to the second port of the 90° hybrid combiner 840.

The second resonant circuit 870 receives the second PA output signal from the drain of the transistor 836 of the second PA 830. The second resonant circuit 870 passes a signal of a predetermined frequency, among second PA output signals received from the drain of the transistor 836 of the second PA 830. In other words, the second resonant circuit 870 corresponds to a filter with respect to the second PA output signals input into the second resonant circuit 870. The second resonant circuit 870 outputs the signal of the predetermined frequency.

In more detail, the second resonant circuit 870 includes a series resonant circuit in which the fourth inductor 872 and the sixth capacitor 874 are connected in series. An end of the fourth inductor 872 receives the second PA output signal from the drain of the transistor 836 of the second PA 830. Another end of the fourth inductor 872 is connected to an end of the sixth capacitor 874. Another end of the sixth capacitor 874 is connected to the fourth port of the 90° hybrid combiner 840.

The 90° hybrid combiner 840 is classified into an upper portion and a lower portion based on the second inductor 860 and the third inductor 862. Additionally, the seventh capacitor 864 includes a relatively large capacitance, and may be connected in series to the second inductor 860 (as shown) or the third inductor 862 that crosses between the upper portion and the lower portion, to perform DC signal separation. The DC signal separation includes a separation between the DC signal of the voltage $V_{DD}$ to be provided to the drain of the transistor 826 of the first PA 820, and the DC signal of the voltage $V_{DD}$ to be provided to the drain of the transistor 836 of the second PA 830.

That is, the second inductor 860 and the seventh capacitor 864 may be connected in series, and may be disposed between the first port of the 90° hybrid combiner 840 and the third port of the 90° hybrid combiner 840. The seventh capacitor 864 separates the DC signal of the voltage $V_{DD}$ to be provided to the drain of the transistor 826 of the first PA 820 from the DC signal of the voltage $V_{DD}$ to be provided to the drain of the transistor 836 of the second PA 830. Accordingly, the seventh capacitor 864 may be referred to as a DC blocking capacitor.

If the seventh capacitor 864 is excluded from the amplifier 800, the DC signal of the voltage $V_{DD}$ to be provided to the drain of the transistor 826 of the first PA 820 may be connected to the DC signal of the voltage $V_{DD}$ to be provided to the drain of the transistor 836 of the second PA 830. If the DC signal of the voltage $V_{DD}$ to be provided to the drain of the transistor 826 of the first PA 820 is connected to the DC signal of the voltage $V_{DD}$ to be provided to the drain of the transistor 836 of the second PA 830, the inductor 824 of the first PA 820, or the inductor 834 of the second PA 830, may be excluded from the amplifier 800.

Through the DC signal separation, each of the first PA 820 in the upper portion and the second PA 830 in the lower portion operates as a class-E amplifier. Accordingly, the amplifier 800 includes a relatively high efficiency.

The transistor 826 of the first PA 820 and the transistor 836 of the second PA 830 may be operated while including a 90° phase difference. Due to the phase difference, the amplifier 800 may be relatively insensitive to load conditions. Accordingly, the 90° hybrid combiner 84 combines the first PA input and the second PA input signal that are amplified by the first PA 820 and the second PA 830, respectively, to be in phase, to generate and output the output signal at the second port of the 90° hybrid combiner 840, which corresponds to an output end.

The amplifier 800 includes a structure that performs load matching, without an additional load matching network. As an example, the 90° hybrid splitter 810 may perform the function of the output matching network 560 of FIG. 5, by adjusting a capacitance of at least one of the capacitors included in the 90° hybrid splitter 810, or an inductance of at least one of the inductors included in the 90° hybrid splitter 810. As another example, the 90° hybrid combiner 840 may perform the function of the output matching network 560, by adjusting a capacitance of at least one of the capacitors included in the 90° hybrid combiner 840, or an inductance of at least one of the inductors included in the 90° hybrid combiner 840. Accordingly, additional input matching and output matching is unnecessary with respect to the amplifier 800. For example, a component corresponding to the output matching network 560 is unnecessary in the amplifier 800, and thus, the amplifier 800 includes a relatively simple circuit configuration.

The amplifier 800 maintains a relatively high efficiency in a relatively broad range of output by controlling power and voltages of the first and second PA input signals to be input into the first PA 820 and the second PA 830, respectively, in order to control power of the output signal. Further, the amplifier 800 maintains constant transmission power, despite an unstable load. The amplifier 800 includes a configuration using a lumped component, and thus, may be used in a high frequency-very high frequency (HF-VHF) band in which a configuration using an isolator may be difficult.

When the amplifier 800 insensitive to a change in a load is used, improvement of an overall performance of a transmitter for which load conditions are changeable is expected. The transmitter may correspond to the source device 110 of FIG. 1.

Although a relatively low operating frequency is used, a burden of a size of the amplifier 800 may be reduced by configuring the amplifier 800 to use the lumped component. When the burden of the size of the amplifier 800 decreases, a range of an application to which the amplifier 800 is applied is improved.

Figure 9:
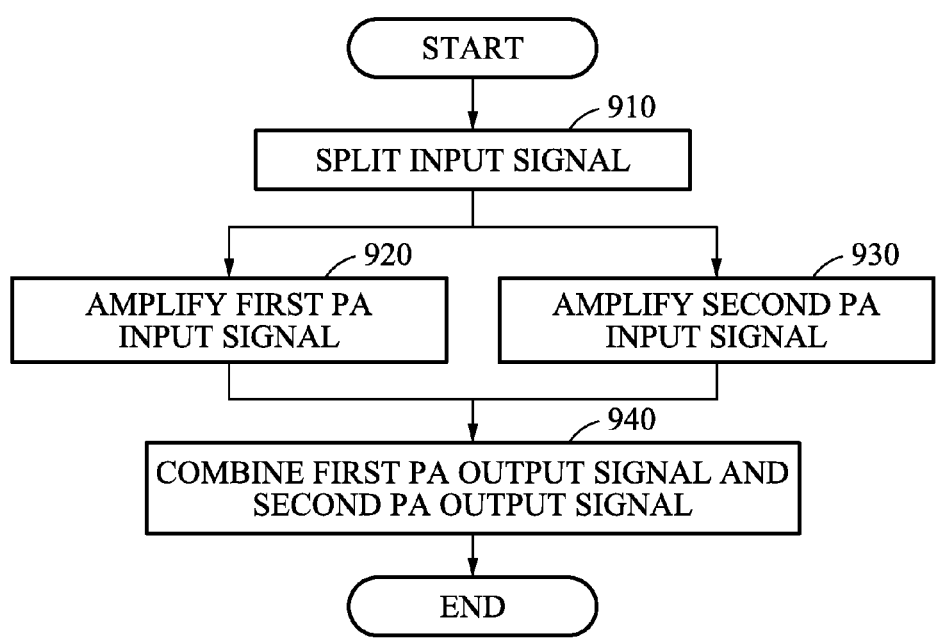
FIG. 9 is a flowchart illustrating an example of an amplification method.

FIG. 9 is a flowchart illustrating an example of an amplification method. The amplification method may be performed by the amplifier 800 of FIG. 8.

In operation 910, the 90° hybrid splitter 810 splits an input signal into a first PA input signal and a second PA input signal, including a 90° phase difference. In operation 920, the first PA 820 amplifies the first PA input signal to generate a first PA output signal.

In operation 930, the second PA 830 amplifies the second PA input signal to generate a second PA output signal. In operation 940, the 90° hybrid combiner 840 combines the first PA output signal and the second PA output signal, including a 90° phase difference, to be in phase, to generate an output signal.

The technical descriptions provided with reference to FIGS. 1 through 8 may be applied identically to the amplification method of FIG. 9, and thus, detailed descriptions will be omitted for conciseness.

Figure 10A:
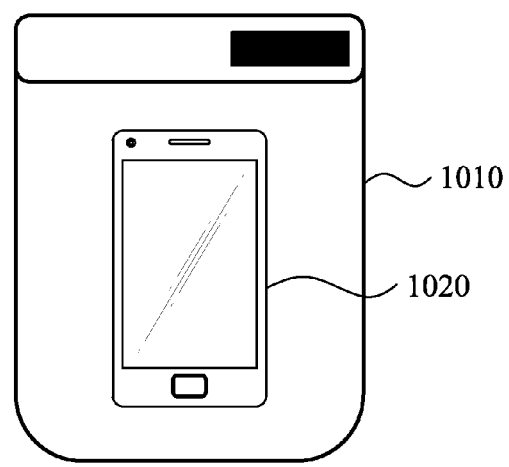
FIGS. 10A through 11B are diagrams illustrating examples of applications in which a wireless power receiver and a wireless power transmitter are mounted.

FIGS. 10A through 11B are diagrams illustrating examples of applications in which a wireless power receiver and a wireless power transmitter are mounted. FIG. 10A illustrates an example of wireless power charging between a pad 1010 and a mobile terminal 1020, and FIG. 10B illustrates an example of wireless power charging between pads 1030 and 1040 and hearing aids 1050 and 1060, respectively.

Referring to FIG. 10A, a wireless power transmitter is mounted in the pad 1010, and a wireless power receiver is mounted in the mobile terminal 1020. The pad 1010 charges a single mobile terminal, namely, the mobile terminal 1020.

Figure 10B:
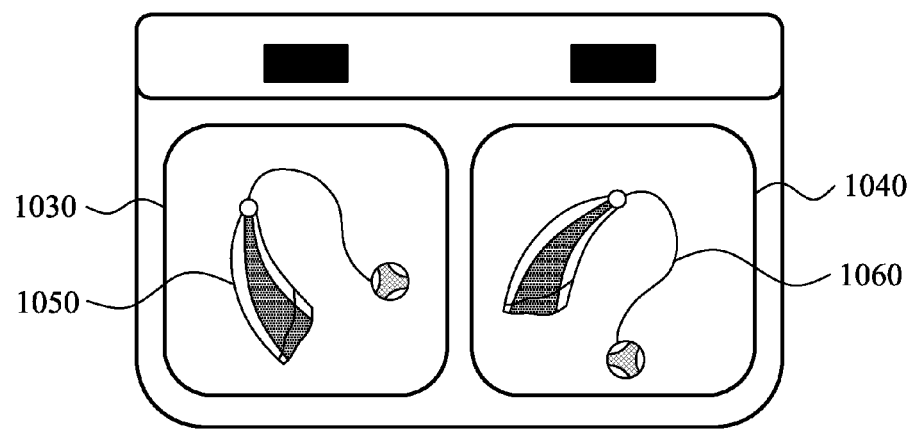

Referring to FIG. 10B, two wireless power transmitters are respectively mounted in the pads 1030 and 1040. The hearing aids 1050 and 1060 are used for a left ear and a right ear, respectively. Two wireless power receivers are respectively mounted in the hearing aids 1050 and 1060. The pads 1030 and 1040 charge two hearing aids, respectively, namely, the hearing aids 1050 and 1060.

Figure 11A:
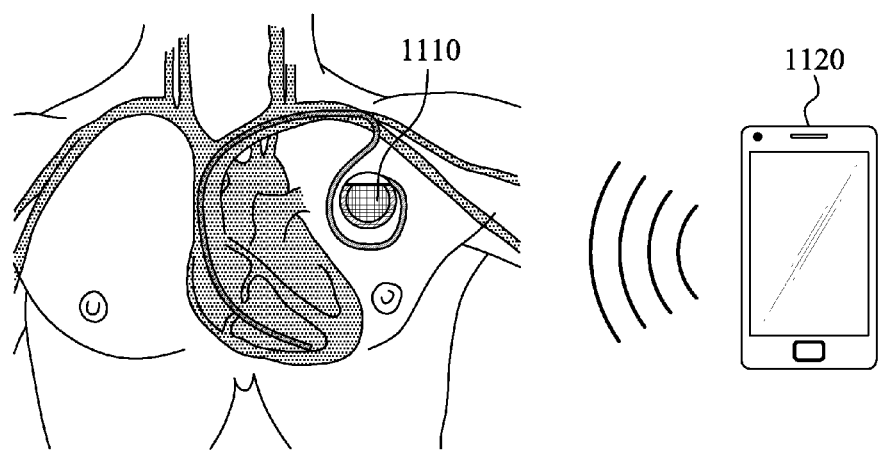
Figure 11B:
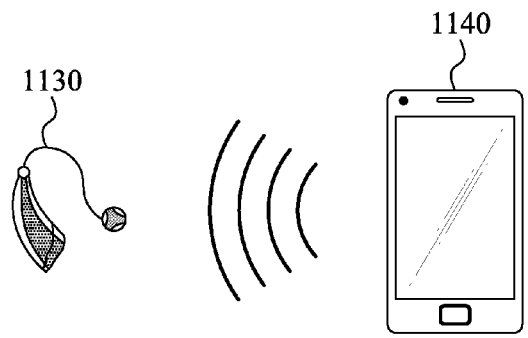

FIG. 11A illustrates an example of wireless power charging between an electronic device 1110 inserted into a human body, and a mobile terminal 1120. FIG. 11B illustrates an example of wireless power charging between a hearing aid 1130 and a mobile terminal 1140.

Referring to FIG. 11A, a wireless power transmitter and a wireless power receiver are mounted in the mobile terminal 1120. Another wireless power receiver is mounted in the electronic device 1110. The electronic device 1110 is charged by receiving power from the mobile terminal 1120.

Referring to FIG. 11B, a wireless power transmitter and a wireless power receiver are mounted in the mobile terminal 1140. Another wireless power receiver is mounted in the hearing aid 1130. The hearing aid 1130 is charged by receiving power from the mobile terminal 1140. Low-power electronic devices, for example, Bluetooth earphones, may also be charged by receiving power from the mobile terminal 1140.

Figure 12:
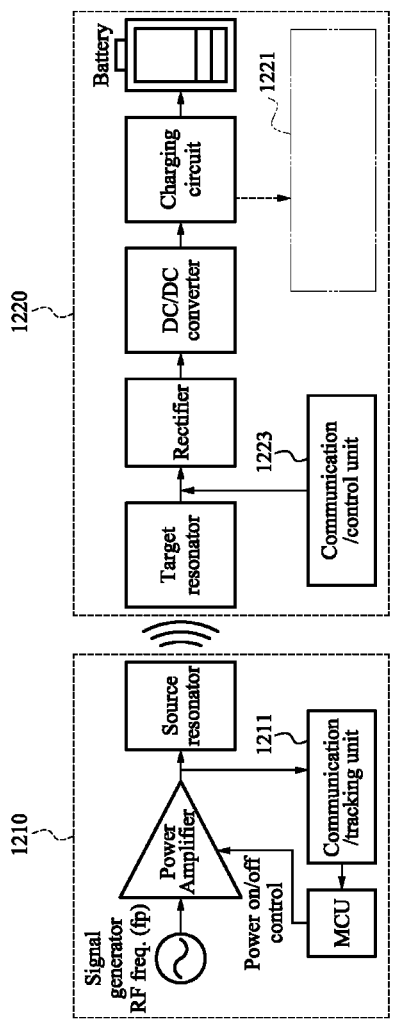
FIG. 12 is a diagram illustrating an example of a wireless power transmitter and a wireless power receiver.

FIG. 12 is a diagram illustrating an example of a wireless power transmitter and a wireless power receiver. Referring to FIG. 12, a wireless power transmitter 1210 may be mounted in each of the pad 1010 of FIG. 10A and pads 1030 and 1040 of FIG. 10B. Additionally, the wireless power transmitter 1210 may be mounted in each of the mobile terminal 1120 of FIG. 11A and the mobile terminal 1140 of FIG. 11B.

In addition, a wireless power receiver 1220 may be mounted in each of the mobile terminal 1020 of FIG. 10A and the hearing aids 1050 and 1060 of FIG. 10B. Further, the wireless power receiver 1220 may be mounted in each of the electronic device 1110 of FIG. 11A and the hearing aid 1130 of FIG. 11B.

The wireless power transmitter 1210 may include a similar configuration to the source device 110 of FIG. 1. For example, the wireless power transmitter 1210 may include a unit configured to transmit power using magnetic coupling.

Referring to FIG. 12, the wireless power transmitter 1210 includes a signal generator, a power amplifier, a microcontroller unit (MCU), a source resonator, and a communication/tracking unit 1211. The communication/tracking unit 1211 communicates with the wireless power receiver 1220, and controls an impedance and a resonance frequency to maintain a wireless power transmission efficiency. Additionally, the communication/tracking unit 1211 may perform similar functions to the power converter 114 and the control/communication unit 115 of FIG. 1.

The wireless power receiver 1220 may include a similar configuration to the target device 120 of FIG. 1. For example, the wireless power receiver 1220 may include a unit configured to wirelessly receive power and to charge a battery.

Referring to FIG. 12, the wireless power receiver 1220 includes a target resonator, a rectifier, a DC/DC converter, and a charging circuit. Additionally, the wireless power receiver 1220 includes a communication/control unit 1223. The communication/control unit 1223 communicates with the wireless power transmitter 1210, and performs an operation to protect overvoltage and overcurrent.

The wireless power receiver 1220 may include a hearing device circuit 1221. The hearing device circuit 1221 may be charged by a battery. The hearing device circuit 1221 may include a microphone, an analog-to-digital converter (ADC), a processor, a digital-to-analog converter (DAC), and a receiver. For example, the hearing device circuit 1221 may include the same configuration as a hearing aid.

The units described herein may be implemented using hardware components, software components, or a combination thereof. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more computer readable recording mediums.

The computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments accomplishing the examples disclosed herein can be easily construed by programmers skilled in the art to which the examples pertain based on and using the flow diagrams and block diagrams of the figures and their corresponding descriptions as provided herein.

As a non-exhaustive illustration only, a device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An amplifier comprising:
   a splitter configured to split an input signal into a first input signal and a second input signal that comprise a 90° phase difference;
   a first power amplifier (PA) configured to amplify the first input signal to generate a first output signal;
   a second PA configured to amplify the second input signal to generate a second output signal; and
   a combiner configured to combine the first output signal and the second output signal that comprise the 90° phase difference to generate an output signal, wherein the combiner comprises a first resonant circuit coupled to the first PA and a second resonant circuit coupled to the second PA, and
   wherein each of the splitter and the combiner comprises a branch-line coupler using a lumped component.

2. The amplifier of claim 1, wherein each of the splitter and the combiner comprises:
   ports; and
   quarter-wave transmission lines configured to connect respective pairs of the ports.

3. The amplifier of claim 1, wherein each of the splitter and the combiner comprises:
   quarter-wave transmission lines, each of the quarter-wave transmission lines comprising a first capacitor, an inductor, and a second capacitor.

4. The amplifier of claim 3, wherein the first capacitor and the second capacitor comprise identical capacitances.

5. The amplifier of claim 1, wherein:
   the first PA comprises a first transistor comprising a drain, the first transistor configured to be switched ON and OFF;
   the second PA comprises a second transistor comprising a drain, the second transistor configured to be switched ON and OFF;
   the combiner comprises a first port, a second port, a first capacitor, and a second capacitor;
   the drain of the first transistor is connected to the first port;
   the drain of the second transistor is connected to the second port;
   the first capacitor is connected to the first port, and is configured to accumulate and release a charge when the first transistor is switched ON and OFF, respectively; and
   the second capacitor is connected to the second port, and is configured to accumulate and release a charge when the second transistor is switched ON and OFF, respectively.

6. The amplifier of claim 1, wherein:
   the first PA comprises a transistor comprising a drain;
   the combiner comprises a first port, a second port, and a series resonant circuit, the series resonant circuit comprising an inductor and a capacitor that are connected in series;
   the drain of the transistor is connected to the first port;

the series resonant circuit is disposed between the first port and the second port; and the second port is configured to output the output signal.

7. The amplifier of claim 1, wherein:

the second PA comprises a transistor comprising a drain;

the combiner comprises a first port, a second port, and a series resonant circuit, the series resonant circuit comprising an inductor and a capacitor that are connected in series;

the drain of the transistor is connected to the first port; and the series resonant circuit is disposed between the first port and the second port.

8. The amplifier of claim 1, wherein:

the first PA comprises a first transistor comprising a drain;

the second PA comprises a second transistor comprising a drain;

the combiner comprises a first port, a second port, a capacitor, and an inductor, the capacitor and the inductor being connected in series;

the drain of the first transistor is connected to the first port;

the drain of the second transistor is connected to the second port; and the capacitor and the inductor are disposed between the first port and the second port.

9. The amplifier of claim 8, wherein the capacitor is configured to separate a direct current (DC) signal to be provided to the drain of the first transistor from a DC signal to be provided to the drain of the second transistor.

10. An amplification method comprising:

splitting an input signal into a first input signal and a second input signal that comprise a 90° phase difference by a branch-line coupler using a lumped component;

amplifying the first input signal to generate a first output signal;

amplifying the second input signal to generate a second output signal; and combining the first output signal and the second output signal that comprise a 90° phase difference to generate an output signal by a branch-line coupler using a lumped component and comprising at least one resonant circuit.

11. The method of claim 10, wherein:

the splitting and the combining are performed by a splitter and a combiner, respectively; and each of the splitter and the combiner comprises ports, and quarter-wave transmission lines connecting respective pairs of the ports.

12. The method of claim 10, wherein:

the splitting and the combining are performed by a splitter and a combiner, respectively; and each of the splitter and the combiner comprises quarter-wave transmission lines, each of the quarter-wave transmission lines comprising a first capacitor, an inductor, and a second capacitor.

13. The method of claim 12, wherein the first capacitor and the second capacitor comprise identical capacitances.

14. The method of claim 10, wherein:

the amplifying of the first input signal, the amplifying of the second input signal, and the combining are performed by a first power amplifier (PA), a second PA, and a combiner, respectively;

the first PA comprises a first transistor comprising a drain, the first transistor configured to be switched ON and OFF;

the second PA comprises a second transistor comprising a drain, the second transistor configured to be switched ON and OFF;

the combiner comprises a first port, a second port, a first capacitor, and a second capacitor;

the drain of the first transistor is connected to the first port;

the drain of the second transistor is connected to the second port;

the first capacitor is connected to the first port;

the second capacitor is connected to the second port; and the method further comprises accumulating and releasing, by the first capacitor, a charge when the first transistor is switched ON and OFF, respectively, and accumulating and releasing, by the second capacitor, a charge when the second transistor is switched ON and OFF, respectively.

15. The method of claim 10, wherein:

the amplifying of the first input signal, the amplifying of the second input signal, and the combining are performed by a first power amplifier (PA), a second PA, and a combiner, respectively;

the first PA comprises a transistor comprising a drain;

the combiner comprises a first port, a second port, and a series resonant circuit, the series resonant circuit comprising an inductor and a capacitor that are connected in series;

the drain of the transistor is connected to the first port;

the series resonant circuit is disposed between the first port and the second port; and the method further comprises outputting, by the second port, the output signal.

16. The method of claim 10, wherein:

the amplifying of the first input signal, the amplifying of the second input signal, and the combining are performed by a first power amplifier (PA), a second PA, and a combiner, respectively;

the second PA comprises a transistor comprising a drain;

the combiner comprises a first port, a second port, and a series resonant circuit, the series resonant circuit comprising an inductor and a capacitor that are connected in series;

the drain of the transistor is connected to the first port; and the series resonant circuit is disposed between the first port and the second port.

17. The method of claim 10, wherein:

the amplifying of the first input signal, the amplifying of the second input signal, and the combining are performed by a first power amplifier (PA), a second PA, and a combiner, respectively;

the first PA comprises a first transistor comprising a drain;

the second PA comprises a second transistor comprising a drain;

the combiner comprises a first port, a second port, a capacitor, and an inductor, the capacitor and the inductor being connected in series;

the drain of the first transistor is connected to the first port;

the drain of the second transistor is connected to the second port; and the capacitor and the inductor are disposed between the first port and the second port.

18. The method of claim 17, further comprising:

separating, by the capacitor, a direct current to be provided to the drain of the first transistor from a direct current to be provided to the drain of the second transistor.

* * * * *